US009843375B2

(12) United States Patent
Kim et al.

(10) Patent No.: US 9,843,375 B2
(45) Date of Patent: Dec. 12, 2017

(54) ELECTRONIC DEVICE AND ANTENNA CONTROL METHOD THEREOF

(71) Applicant: Samsung Electronics Co., Ltd., Suwon-si, Gyeonggi-do (KR)

(72) Inventors: Sung-Soo Kim, Suwon-si (KR); Min-Chull Paik, Suwon-si (KR); Jong-In Lee, Hwaseong-si (KR); Chang-Won Jang, Suwon-si (KR); Seung-Min Lee, Seoul (KR); Jae-Min Cha, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/177,854

(22) Filed: Jun. 9, 2016

(65) Prior Publication Data

US 2016/0365909 A1 Dec. 15, 2016

(30) Foreign Application Priority Data

Jun. 10, 2015 (KR) ........................ 10-2015-0082187

(51) Int. Cl.
*H04B 1/44* (2006.01)
*H04B 7/00* (2006.01)
(Continued)

(52) U.S. Cl.
CPC ........... *H04B 7/0608* (2013.01); *H03F 3/195* (2013.01); *H03F 3/245* (2013.01); *H04B 1/006* (2013.01);
(Continued)

(58) Field of Classification Search
CPC ... H04B 1/16; H04B 1/38; H04B 1/40; H04B 1/44; H04B 1/48; H04B 1/0064; H04B 1/406; H04B 17/318
(Continued)

(56) References Cited

U.S. PATENT DOCUMENTS 8,750,814 B2 * 6/2014 Lee .......................... H04B 1/18
455/78
8,761,688 B2 * 6/2014 Wu ......................... H04B 1/006
455/226.1
(Continued)

FOREIGN PATENT DOCUMENTS

KR 10-2011-0062399 A 6/2011
KR 10-2016-0100150 A 8/2016

*Primary Examiner* — Quochien B Vuong
(74) *Attorney, Agent, or Firm* — Jefferson IP Law, LLP

(57) ABSTRACT

An electronic device is provided. The electronic device includes a first antenna, a second antenna, a transmission/reception path unit, a first reception path unit, a second reception path unit including a low noise amplifier (LNA), a signal path selection unit configured to connect each of the first antenna and the second antenna to the transmission/reception path unit, the first reception path unit, or the second reception path unit, and a radio frequency integrated circuit (RFIC) module or a processor including the RFIC module configured to control the signal path selection unit to have a first state in which the first antenna is connected to the transmission/reception path unit and the second antenna is connected to the second reception path unit or control the signal path selection unit to have a second state in which the first antenna is connected to the first reception path unit and the second antenna is connected to the transmission/reception path unit.

19 Claims, 14 Drawing Sheets

(51) Int. Cl.

| | |
|---|---|
| *H04B 7/06* | (2006.01) |
| *H04B 1/00* | (2006.01) |
| *H04B 17/318* | (2015.01) |
| *H03F 3/195* | (2006.01) |
| *H03F 3/24* | (2006.01) |
| *H04B 17/10* | (2015.01) |
| *H04B 17/14* | (2015.01) |
| *H04B 7/08* | (2006.01) |

(52) U.S. Cl.
CPC ............. *H04B 1/44* (2013.01); *H04B 17/101* (2015.01); *H04B 17/14* (2015.01); *H04B 17/318* (2015.01); *H03F 2200/165* (2013.01); *H03F 2200/294* (2013.01); *H03F 2200/451* (2013.01); *H04B 7/0808* (2013.01); *H04B 7/0822* (2013.01); *H04B 17/102* (2015.01); *H04B 17/103* (2015.01)

(58) Field of Classification Search
USPC ............. 455/77, 78, 226.1, 272, 277.1, 333
See application file for complete search history.

(56) References Cited

U.S. PATENT DOCUMENTS

| | | | |
|---|---|---|---|
| 8,798,552 B2 | 8/2014 | Brobston et al. | |
| 8,849,362 B1* | 9/2014 | Saji ...................... | H05K 1/0218 |
| | | | 455/575.1 |
| 9,106,733 B2* | 8/2015 | Sanchez ............... | H04B 7/0814 |
| 2011/0045786 A1 | 2/2011 | Leinonen et al. | |
| 2012/0112969 A1 | 5/2012 | Caballero et al. | |
| 2012/0112970 A1 | 5/2012 | Caballero et al. | |
| 2012/0315861 A1 | 12/2012 | Wu et al. | |
| 2013/0016632 A1 | 1/2013 | Mujtaba et al. | |
| 2013/0288628 A1 | 10/2013 | Rofougaran et al. | |
| 2014/0187284 A1 | 7/2014 | Sanchez et al. | |
| 2015/0105074 A1 | 4/2015 | Hu et al. | |
| 2016/0241319 A1 | 8/2016 | Kim et al. | |

* cited by examiner

ELECTRONIC DEVICE AND ANTENNA CONTROL METHOD THEREOF

CROSS-REFERENCE TO RELATED APPLICATION(S)

This application claims the benefit under 35 U.S.C. §119 (a) of a Korean patent application filed on Jun. 10, 2015 in the Korean Intellectual Property Office and assigned Serial number 10-2015-0082187, the entire disclosure of which is hereby incorporated by reference.

TECHNICAL FIELD

The present disclosure relates to one or more antennas included in an electronic device providing a voice or data.

BACKGROUND

In general, an electronic device implemented in the form of a portable terminal may include two or more antennas and may transmit/received a voice or data using the two or more antennas.

When the electronic device includes two or more antennas, one antenna may operate for a transmission/reception operation of the electronic device and the other one may operate for a reception operation. Accordingly, one antenna may be connected to a transceiver of the electronic device and the other one may be connected to a receiver.

The above information is presented as background information only to assist with an understanding of the present disclosure. No determination has been made, and no assertion is made, as to whether any of the above might be applicable as prior art with regard to the present disclosure.

SUMMARY

When connections between the antennas included in the electronic device and the transceiver and the receiver are changed, a signal loss in a wireless frequency band may increase when the electronic device 100 transmits/receives a wireless frequency signal. Further, performance of the electronic device may deteriorate.

Aspects of the present disclosure are to address at least the above-mentioned problems and/or disadvantages and to provide at least the advantages described below. Accordingly, an aspect of the present disclosure is to provide an electronic device and a method thereof, which can reduce a signal loss in a wireless signal frequency band and performance deterioration which may be generated due to antenna switching and smoothly perform voice or data transmission/reception.

In accordance with an aspect of the present disclosure, an electronic device is provided. The electronic device includes a first antenna, a second antenna, a transmission/reception path unit, a first reception path unit, a second reception path unit including a low noise amplifier (LNA), a signal path selection unit configured to connect each of the first antenna and the second antenna to the transmission/reception path unit, the first reception path unit, or the second reception path unit, and a radio frequency integrated circuit (RFIC) module or a processor including the RFIC module configured to control the signal path selection unit to have a first state in which the first antenna is connected to the transmission/reception path unit and the second antenna is connected to the second reception path unit or control the signal path selection unit to have a second state in which the first antenna is connected to the first reception path unit and the second antenna is connected to the transmission/reception path unit.

In accordance with another aspect of the present disclosure, a method for controlling antennas of an electronic device is provided. The method includes determining if a first antenna operates as a main antenna and a second antenna operates as a sub antenna, determining performance of the first antenna corresponding to the main antenna, determining whether the performance of the first antenna is suitable for the main antenna, and maintaining or switching the main antenna and the sub antenna based on a result of the determination, wherein maintaining or switching the main antenna and the sub antenna comprises connecting each of the first antenna and the second antenna to a transmission/reception path unit, a first reception path unit, or a second reception path unit including an LNA.

Another aspect of the present disclosure is to provide an electronic device and a method thereof, which can reduce signal loss in a wireless signal frequency band and performance deterioration which may be generated due to antenna switching and smoothly perform voice or data transmission/reception.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1A:
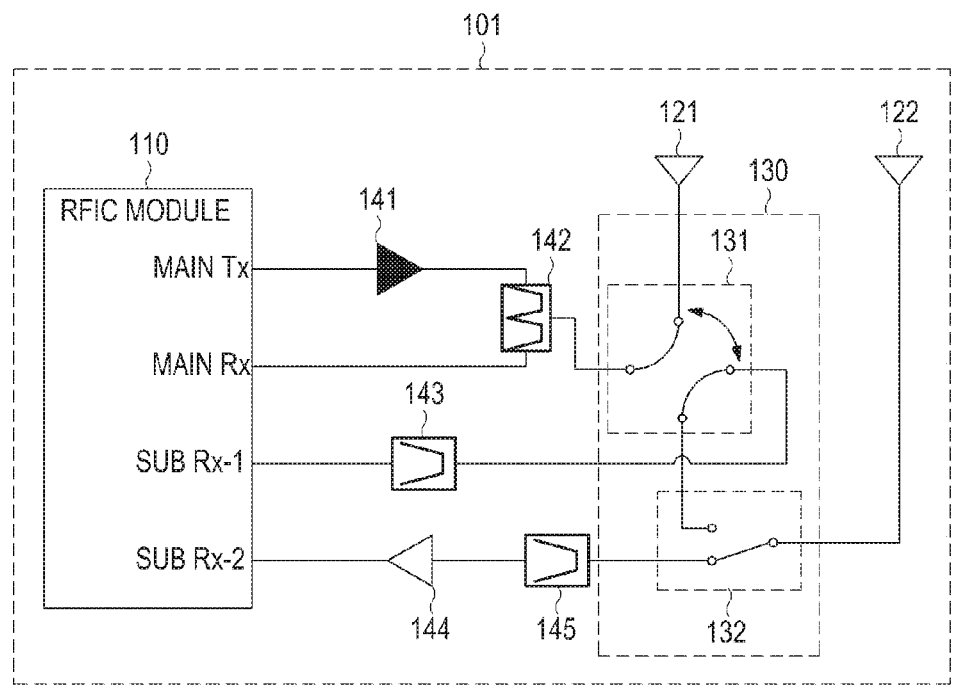
FIGS. 1A and 1B illustrate an example of an antenna configuration of an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a", "an" and "the" include plural referents unless the context clearly dictates otherwise. Thus, for example, reference to "a component surface" includes reference to one or more of such surfaces.

In the present disclosure, the expression "have", "may have", "include" or "may include" refers to existence of a corresponding feature (e.g., numerical value, function, operation, or components such as elements), and does not exclude existence of additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

When it is mentioned that one element (e.g., a first element) is "(operatively or communicatively) coupled with/to or connected to" another element (e.g., a second element), it should be construed that the one element is directly connected to the another element or the one element is indirectly connected to the another element via yet another element (e.g., a third element). Conversely, when one component element is "directly coupled" or "directly connected" to another component element, it may be construed that a third component element does not exist between the first component element and the second component element.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g. embedded processor) only for performing the corresponding operations or a generic-purpose processor (e.g., central processing unit (CPU) or application processor (AP)) that can perform the corresponding operations by executing one or more software programs stored in a memory device.

Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude various embodiments of the present disclosure.

An electronic device according to various embodiments of the present disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a Moving Picture Experts Group phase 1 or phase 2 (MPEG-1 or MPEG-2) audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

According to some embodiments, the electronic device may be a home appliance. The home appliance may include at least one of, for example, a television (TV), a digital video disc (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). In various embodiments, the electronic device may be a combination of one or more of the aforementioned various devices. The electronic device according to some embodiments of the present disclosure may be a flexible device. Further, the electronic device according to an embodiment of the present disclosure is not limited to the aforementioned devices, and may include a new electronic device according to the development of technology.

Hereinafter, an electronic device according to various embodiments will be described with reference to the accompanying drawings. As used herein, the term "user" may indicate a person who uses an electronic device or a device (e.g., an artificial intelligence electronic device) that uses an electronic device.

Figure 1B:
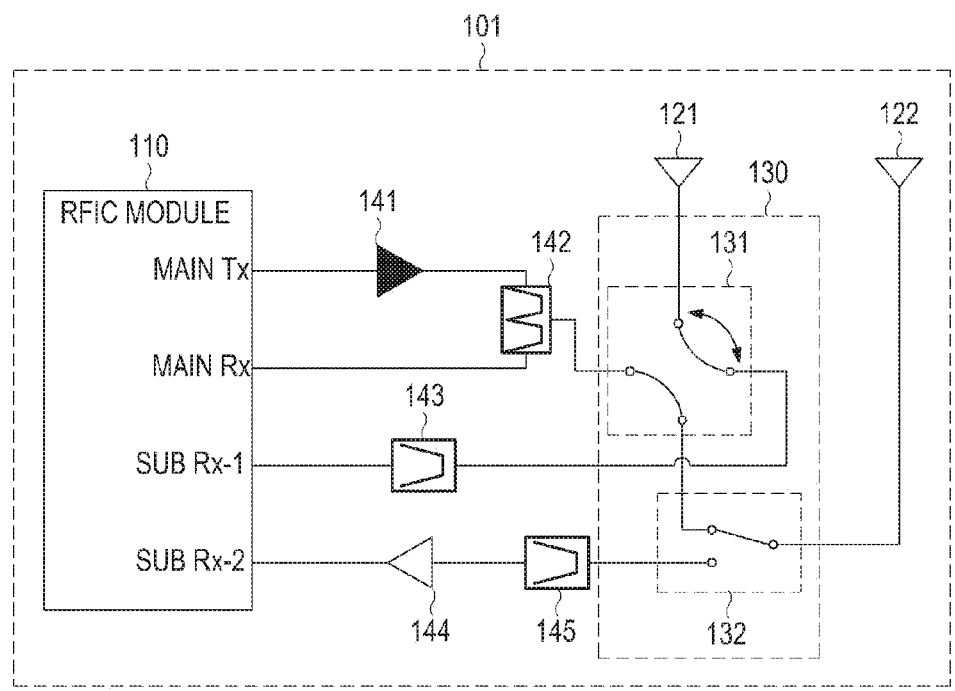

FIGS. 1A and 1B illustrate an example of an antenna configuration of an electronic device according to various embodiments of the present disclosure.

Referring to FIGS. 1A and 1B, an electronic device 101 may include a radio frequency integrated circuit (RFIC) module 110, a plurality of antennas 121 and 122, a signal path selection unit 130, and a plurality of elements 141, 142, 143, 144, 145, and 146. The RFIC module 110 may process signals such as data or calls transmitted/received through the antennas 121 and 122.

Referring to FIG. 1A, the plurality of antennas 121 and 122 may be connected to the RFIC module 110 through the signal path selection unit 130. The signal path selection unit 130 may include a plurality of switches, for example, a first switch 131 or a second switch 132. The RFIC module 110 may include a main transmission terminal (main Tx) for outputting data transmitted through a main antenna, a main reception terminal (main Rx) for receiving data through the main antenna, and a first sub reception terminal (sub Rx-1) and a second sub reception terminal (sub Rx-2) for receiving data through a sub antenna.

The first element 141 or the second element 142 may be connected in between the first switch 131 and the RFIC module 110. Further, the second element 142 may be connected to the first element 141, the main transmission terminal (main Tx) of the RFIC module 110, and the main reception terminal (main Rx) of the RFIC module 110. The first switch 131 may be connected to the first sub transmission terminal (sub Tx-1) of the RFIC module 110 through the third element 143.

The fourth element 144 and the fifth element 145 may be connected in between the second switch 132 and the RFIC module 110. The second antenna 122 may be connected to the fourth element 144 and the fifth element 145 in series, so as to be connected to the second sub reception terminal (sub Rx-2) of the RFIC module 110.

Referring to FIG. 1A, the first antenna 121 operates as the main antenna of the electronic device 101 and the second antenna 122 operates as the sub antenna of the electronic device 101. When the first antenna 121 operates as the main antenna of the electronic device 101, the first antenna 121 may be connected to the main transmission terminal (main Tx) and the main reception terminal (main Rx) of the RFIC module 110 through the first switch 131. A signal received through the first antenna 121 may be transferred to the main reception terminal (main Rx) of the RFIC module 110 via the second element 142. Further, a signal transmitted from the electronic device 101 may be output from the main transmission terminal (main Tx) of the RFIC module 110 and transmitted through the first antenna 121 via the first element 141 and the second element 142.

When the first antenna 121 operates as the main antenna, the second antenna 122 may operate as the sub antenna of the electronic device 101. The second antenna 122 may be connected to the second sub reception terminal (Rx-2) of the RFIC module 110 through the second switch 132. A signal received through the second antenna 122 may be transferred to the second sub reception terminal (sub Rx-2) of the RFIC module 110 via the fifth element 145 and the fourth element 144.

Referring to FIG. 1A, the first switch 131 may be switched to connect the first antenna 121 and the second element 142, and the second switch 132 may be switched to connect the second antenna 122 and the fifth element 145. According to an embodiment, the switching of the first switch 131 or the second switch 132 may be made according to a control of the RFIC module 110 or a processor 620 described below.

Referring to FIG. 1B, the first antenna 121 operates as the sub antenna of the electronic device 101 and the second antenna 122 operates as the main antenna of the electronic device 101. When the first antenna 121 operates as the sub antenna of the electronic device 101, the first antenna 121 may be connected to the first sub reception terminal (sub Rx-1) of the RFIC module 110 through the first switch 131. A signal received through the first antenna 121 may be transferred to the first sub reception terminal (sub Rx-1) of the RFIC module 110 via the third element 143. When the first antenna 121 operates as the sub antenna, the first antenna 121 may be not connected to the second element 142.

When the first antenna 121 operates as the sub antenna, the second antenna 122 may operate as the main antenna of the electronic device 101. The second antenna 122 may be connected to the main transmission terminal (main Tx) and the main reception terminal (main Rx) of the RFIC module 110 through the second switch 132 and the first switch 131. A signal received through the second antenna 122 may be transferred to the main reception terminal (main Rx) of the RFIC module 110 via the second element 142. A signal output from the main transmission terminal (main Tx), that is, a signal transmitted from the electronic device 101 may be output through the second antenna 122 via the first element 141 and the second element 142.

Referring to FIG. 1B, the first switch 131 may be switched to connect the first antenna 121 and the third element 143, and the second switch 132 and the first switch 131 may be switched to connect the second antenna 122 and the second element 142. According to an embodiment, the switching of the first switch 131 or the second switch 132 may be made according to a control of the RFIC module 110 or the processor 620 described below.

According to an embodiment, the first switch 131 may be a double pole double throw (DPDT) switch. The second switch 132 may be a single pole double throw (SPDT) switch. Further, the first element 141 may be a power amplifier, the second element 142 may be a duplexer, and the third element 143 may be a band pass filter (BPF). The fourth element 144 may be a low noise amplifier (LNA) and the fifth element 145 may be a BPF. Pass bands of the third element 143 and the fifth element 145 may overlap each other or may be similar to each other.

According to an embodiment, the electronic device 101 may perform a diversity operation or a multiple input multiple output (MIMO) operation by using the signal received through the main reception terminal (main Rx) and the signal received through the sub reception terminal (sub Rx-1 or sub Rx-2).

Figure 2A:
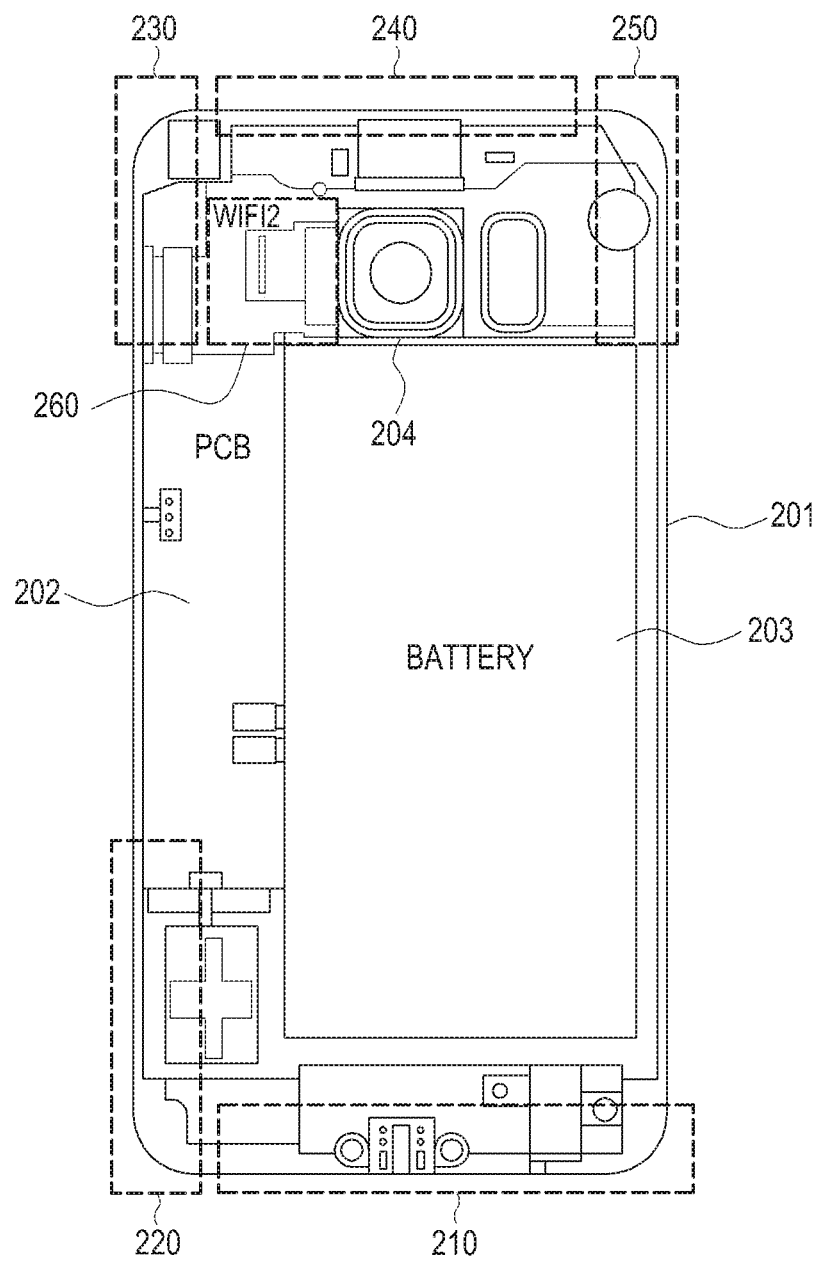
FIGS. 2A and 2B illustrate examples in which antennas are arranged in the electronic device according to various embodiments of the present disclosure.
Figure 2B:
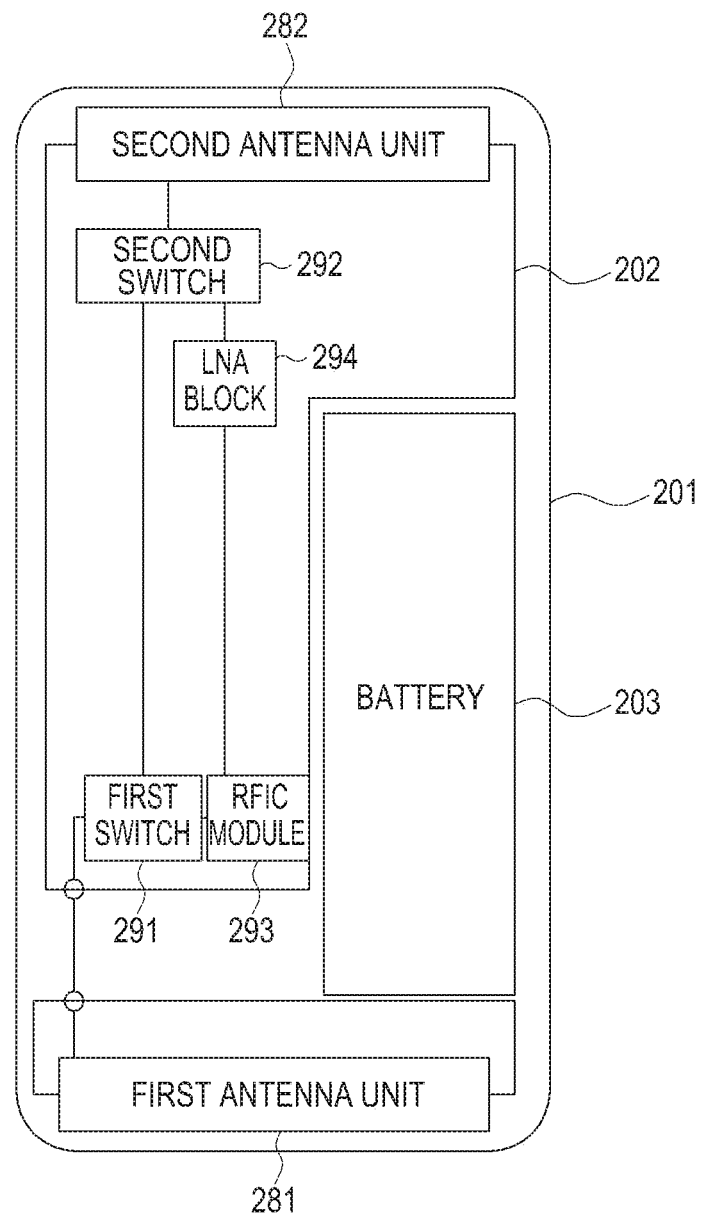

FIGS. 2A and 2B illustrate examples in which antennas are arranged in an electronic device 201 according to various embodiments of the present disclosure.

FIG. 2A illustrates the electronic device 201 including a plurality of antennas according to various embodiments of the present disclosure.

Referring to FIG. 2A, the electronic device 201 may include at least one of a first antenna 210, a second antenna 220, a third antenna 230, a fourth antenna 240, a fifth antenna 250, and a sixth antenna 260. The first to sixth antennas 210 to 260 may be located at an upper portion or a lower portion of a printed circuit board (PCB) of the electronic device 201. The PCB 202, a battery 203, a camera unit 204, and the first to sixth antennas 210 to 260 may be disposed on the rear surface of the electronic device 201.

According to an embodiment, the first antenna 210 and the second antenna 220 may be main antennas of the electronic device 201 for transmitting/receiving a voice or data. The third to sixth antennas 230 to 260 may be sub antennas of the electronic device 201 for receiving a voice or data. According to an embodiment, the first antenna 210 corresponding to the main antenna may transmit/receive a signal of a middle frequency band (for example, 1700 MHz to 2100 MHz) or a low frequency band (for example, 700 MHz to 900 MHz), and the second antenna 220 may transmit/receive a signal of a high frequency band (for example, 2300 MHz to 2700 MHz) or the middle frequency band (for example, 1700 MHz to 2100 MHz). According to an embodiment, the sixth antenna 260 may be an antenna for Wi-Fi.

FIG. 2B illustrates the electronic device 201 including a plurality of antennas on an upper portion and a lower portion of the electronic device 201.

Referring to FIG. 2B, a second antenna unit 282 may be disposed on the upper portion of the electronic device 201 and a first antenna unit 281 may be disposed on the lower portion of the electronic device 201. Further, the PCB 202 may be disposed on an upper left or right side of the electronic device 201 and a battery 203 may be disposed on a right side. A first switch 291, a second switch 292, an RFIC module 293, or an LNA block 294, connected to the first antenna unit 281 or the second antenna unit 282, may be disposed on the PCB 202.

The first antenna unit 281 may be connected to the RFIC module 293 through the first switch 291, and the second antenna unit 282 may be connected to the RFIC module 293 through the first switch 291 and the second switch 292 or connected to the RFIC module 293 through the second switch 292 and the LNA block 294.

Figure 3:
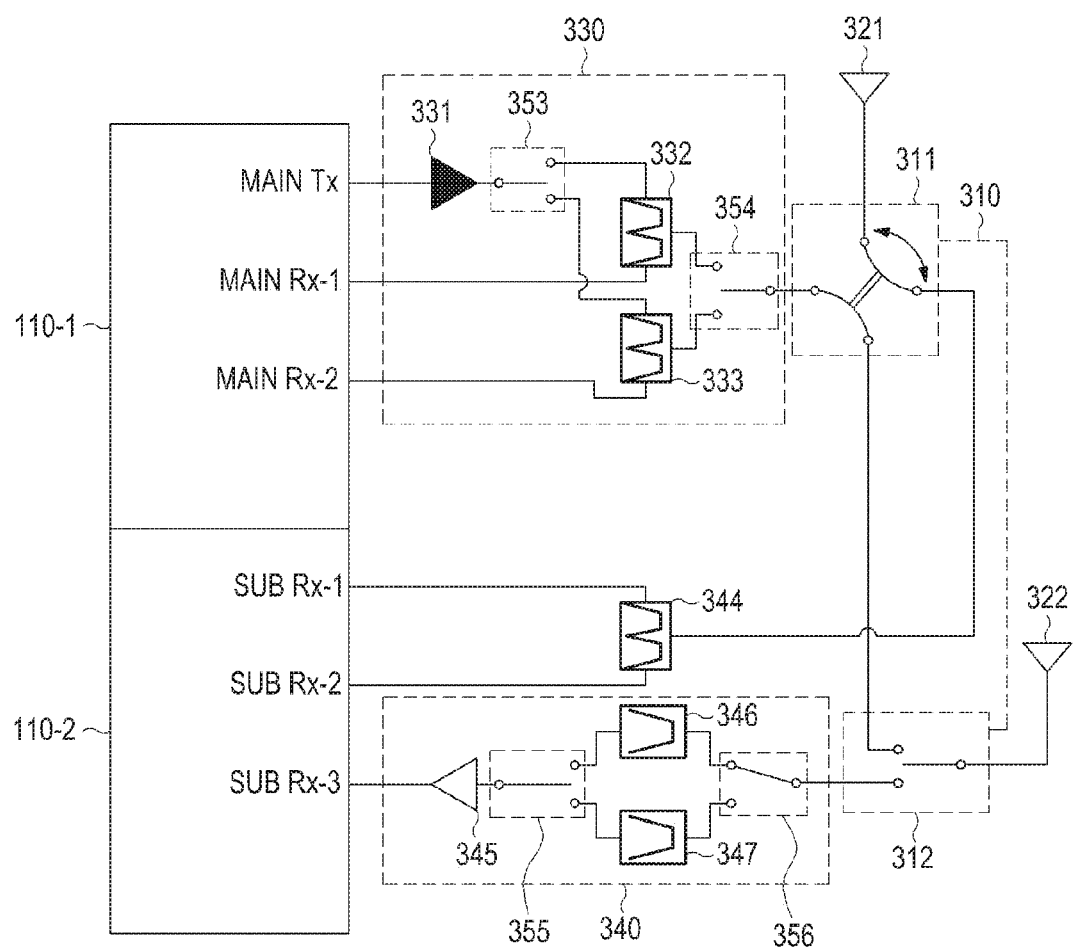
FIG. 3 is a circuit diagram illustrating the electronic device according to various embodiments of the present disclosure.

FIG. 3 illustrates a circuit diagram of the electronic device 201 according to various embodiments of the present disclosure.

Referring to FIG. 3, the electronic device 201 may include at least one of an RFIC module 110 (110-1 and 110-2), a main transceiver 330, a sub receiver 340, a signal path selection unit 310 (311 and 312), a first antenna 321, a second antenna 322, and a fourth element 344.

The electronic device 201 may transmit/receive a signal by using the main transceiver 330 and receive a signal by using the sub receiver 340. In FIG. 3, it is assumed that the first antenna 321 is a main antenna and the second antenna 322 is a sub antenna.

The first antenna 321 may be connected to the main transceiver 330 to transmit/receive a signal or may be connected to the sub receiver 340 to receive a signal. Whether the first antenna 321 is connected to the main transceiver 330 or the sub receiver 340 may be determined by the signal path selection unit 310 including one or more switches. The first antenna 321 may be connected to the main transceiver 330 or the sub receiver 340 through the signal path selection unit 310. A control signal for switching the signal path selection unit 310 may be generated from the RFIC module 110 or the processor 620 and transferred to the signal path selection unit 310.

According to an embodiment, when the first antenna 321 is connected to the main transceiver 330 through the first switch 311, the first antenna 321 may transmit/receive a signal, for example, data or a voice call through the main transceiver 330. At this time, the first antenna 321 may be not connected to the sub receiver 340.

According to an embodiment, the main transceiver 330 may include first to third elements 331, 332, and 333, a third switch 353, or a fourth switch 354. The RFIC module 110 may include the main module 110-1 for transmitting/receiving a signal, for example, data or a voice call of the electronic device 201 and the sub module 110-2 for receiving a signal. The first element 331 may be connected to the main transmission terminal (main Tx) of the main module 110-1, and the second element 332 may be connected to the first main reception terminal (main Rx-1) or the third switch 353 which may be connected to the first element 331. The third element 333 may be connected to the second main reception terminal (main Rx-2) or the third switch 353 which may be connected to the first element 331. The second element 332 and the third element 333 may be duplexers that support different frequency bands. According to an embodiment, a frequency band of the signal transmitted/received through the first antenna 321 may be different when the first antenna 321 is connected to the second element 332 and when the first antenna 321 is connected to the third element 333.

According to an embodiment, the first antenna 321 may be connected to the fourth switch 354 through the first switch 311, the fourth switch 354 may be connected to the second element 332, and the second element 332 may be connected to the first element 331 through the third switch 353. As described above, the first antenna 321 may be connected to the main transmission terminal (main Tx) of the main module 110-1 through the first switch 311, the fourth switch 354, the second element 332, the third switch 353, and the first element 331. Further, the first antenna 321 may be connected to the fourth switch 354 through the first switch 311, the fourth switch 354 may be connected to the second element 332, and the second element 332 may be connected to the first main reception terminal (main Rx-1) of the main module 110-1. As described above, the first antenna 321 may be connected to the first main reception terminal (main Rx-1) of the main module 110-1 through the first switch 311, the fourth switch 354, and the second element 332.

The signal, for example, data or a voice call received through the first antenna 321 may be transferred to the first main reception terminal (main Rx-1) of the main module 110-1 via the first switch 311, the fourth switch 354, and the second element 332. Further, the signal transmitted from the electronic device 101 may be transferred to the first antenna 321 from the main transmission terminal (main Tx) of the main module 110-1 via the first element 331, the third switch 353, the second element 332, the fourth switch 354, and the first switch 311. The signal transferred to the first antenna 321 may be output through the first antenna 321.

According to another embodiment, the first antenna 321 may be connected to the fourth switch 354 through the first switch 311, and the fourth switch 354 may be connected to the third element 333. Since the third element 333 is connected to the main transmission terminal (main Tx) and connected to the second main reception terminal (main Rx-2) of the main module 110-1 through the third switch 353 and the first element 331, the first antenna 321 may be connected the second main reception terminal (main Rx-2) through the fourth switch 354 and the third element 333, and connected to the main transmission terminal (main Tx) through the fourth switch 354, the third element 333, the third switch 353 and the first element 331. At this time, the signal, for example, data or a voice call received through the first antenna 321 may be transferred to the second main reception terminal (main Rx-2) of the main module 110-1 via the first switch 311, the fourth switch 354, and the third element 333. Further, the signal transmitted from the electronic device 101 may be transferred to the first antenna 321 from the main transmission terminal (main Tx) of the main module 110-1 via the first element 331, the third switch 353, the third element 333, the fourth switch 354, and the first switch 311. The signal may be output through the first antenna 321.

According to an embodiment, the first antenna 321 may be connected to the fourth element 344 through the first switch 311. The fourth element 344 may be connected to the first sub reception terminal (sub Rx-1) and the second sub reception terminal (sub Rx-2) of the sub module 110-2. The first antenna 321 may be connected to the first sub reception terminal (sub Rx-1) and the second sub reception terminal (sub Rx-2) of the sub module 110-2 through the first switch 311, and thus operate as the sub antenna of the electronic device 201. The fourth element 344 may be a dual saw filter or a duplexer including BPFs of different frequency bands.

The sub receiver 340 may include fifth to seventh elements 345, 346, and 347, a fifth switch 355, or a sixth switch 356. The fifth element 345 may be connected to a third sub transmission terminal (sub Rx-3) of the sub module 110-2, and may be connected to one of the sixth element 346 and the seventh element 347 through the fifth switch 355. The sixth element 346 and the seventh element 347 may be connected to the second switch 312 through the sixth switch 356, and the second antenna 322 may be connected to the main transceiver 330 or the sub receiver 340 through the second switch 312 and thus connected to the main module 110-1 or the sub module 110-2 of the RFIC module 110.

When the second antenna 322 operates as the sub antenna of the electronic device 201, the second antenna 322 may be connected to the sixth switch 356 through the second switch 312 and the sixth switch 356 may be connected to the sixth element 346 or the seventh element 347. When the second antenna 322 is connected to the sixth switch 356 through the second switch 312, the sixth switch 356 is connected to the sixth element 346, and the sixth element 346 is connected to the fifth element 345 through the fifth switch 355, the second antenna 322 may be connected to the third sub reception terminal (sub Rx-3) of the sub module 110-2. The second antenna 322 connected to the third sub reception terminal (sub Rx-3) may be correspond to the sub antenna, and may receive a signal, for example, data or a voice call received by the electronic device 201 and transfer the signal to the third sub reception terminal (sub Rx-3) of the sub module 110-2

Further, when the second antenna 322 is connected to the sixth switch 356 through the second switch 312, the sixth switch 356 is connected to the seventh element 347, and the seventh element 347 is connected to the fifth element 345 through the fifth switch 355, the second antenna 322 may be connected to the third sub reception terminal (sub Rx-3) of the sub module 110-2. The second antenna 322 connected to the third sub reception terminal (sub Rx-3) may correspond to the sub antenna, and may receive a signal, for example, data or a voice call received by the electronic device 201 and transfer the signal to the third sub reception terminal (sub Rx-3) of the sub module 110-2

According to an embodiment, the second antenna 322 may operate as the main antenna of the electronic device 201. The second antenna 322 may be connected to the fourth switch 354 of the main transceiver 330 through the second switch 312 and the first switch 311. The fourth switch 354 may be connected to the second element 332 or the third element 333. When the second antenna 322 is connected to the fourth switch 354 through the second switch 312 and the first switch 311, the fourth switch 354 is connected to second element 332, and the second element 332 is connected to the first element 331 through the third switch 353, the second antenna 322 may be connected to the main transmission terminal (main Tx) of the main module 110-1. Further, when the second antenna 322 is connected to the fourth switch 354 of the main transceiver 330 through the second switch 312 and the first switch 311, the fourth switch 354 is connected to the third element 333, and the third element 333 is connected to the first element 331 through the third switch 353, the second antenna 322 may be connected to the main transmission terminal (main Tx) of the main module 110-1. Accordingly, the second antenna 322 may transfer a signal as the main antenna of the electronic device 201.

The second antenna 322 may be connected to the fourth switch 354 of the main transceiver 330 through the second switch 312 and the first switch 311, and the fourth switch 354 may be connected to the second element 332 or the third element 333. When the second antenna 322 is connected to the fourth switch 354 through the second switch 312 and the first switch 311, and when the fourth switch 354 is connected to the second element 332, the second antenna 322 may be connected to the first main reception terminal (main Rx-1) of the main module 110-1. Further, when the second antenna 322 is connected to the fourth switch 354 of the main transceiver 330 through the second switch 312 and the first switch 311, and when the fourth switch 354 is connected to the third element 333, the second antenna 322 may be connected to the second main reception terminal (main Rx-2) of the main module 110-1. Accordingly, the second antenna 322 may receive a signal as the main antenna of the electronic device 201.

According to an embodiment, the electronic device 201 may perform a diversity operation or a MIMO operation by using the signal received through the main reception terminal (main Rx-1 or main Rx-2) and the signal received through the sub reception terminal (sub Rx-1, sub Rx-2, or sub Rx-3).

As the second antenna 322 is connected to the first element 331 and the third element 333, the second antenna 322 may be connected to the main transmission terminal (main Tx) and the second main reception terminal (main Rx-2) of the main module 110-1. Accordingly, the second antenna 322 may transmit/receive a signal as the main antenna of the electronic device 201. When the second antenna 322 operates as the main antenna, the first antenna 321 may operate as the sub antenna.

Figure 4A:
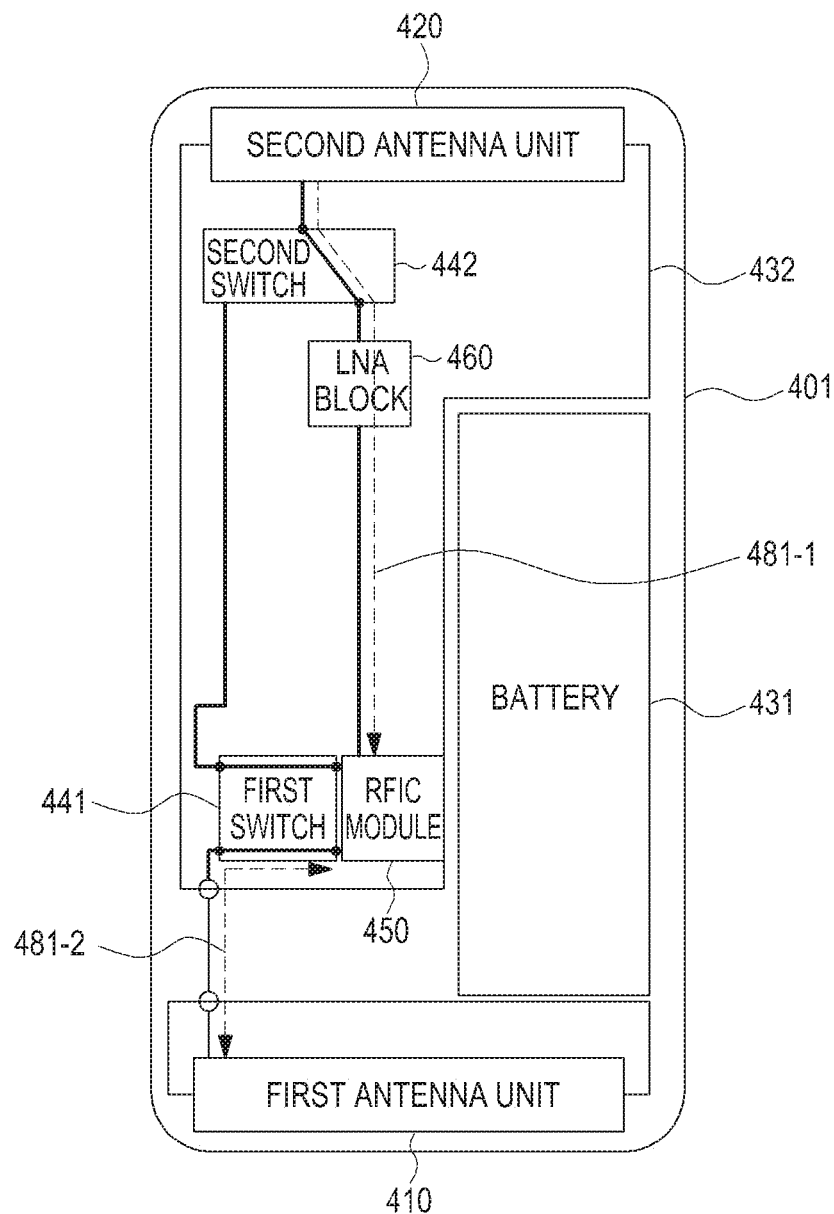
FIGS. 4A to 4C illustrate signal flows along antenna connections of the electronic device according to various embodiments of the present disclosure.
Figure 4B:
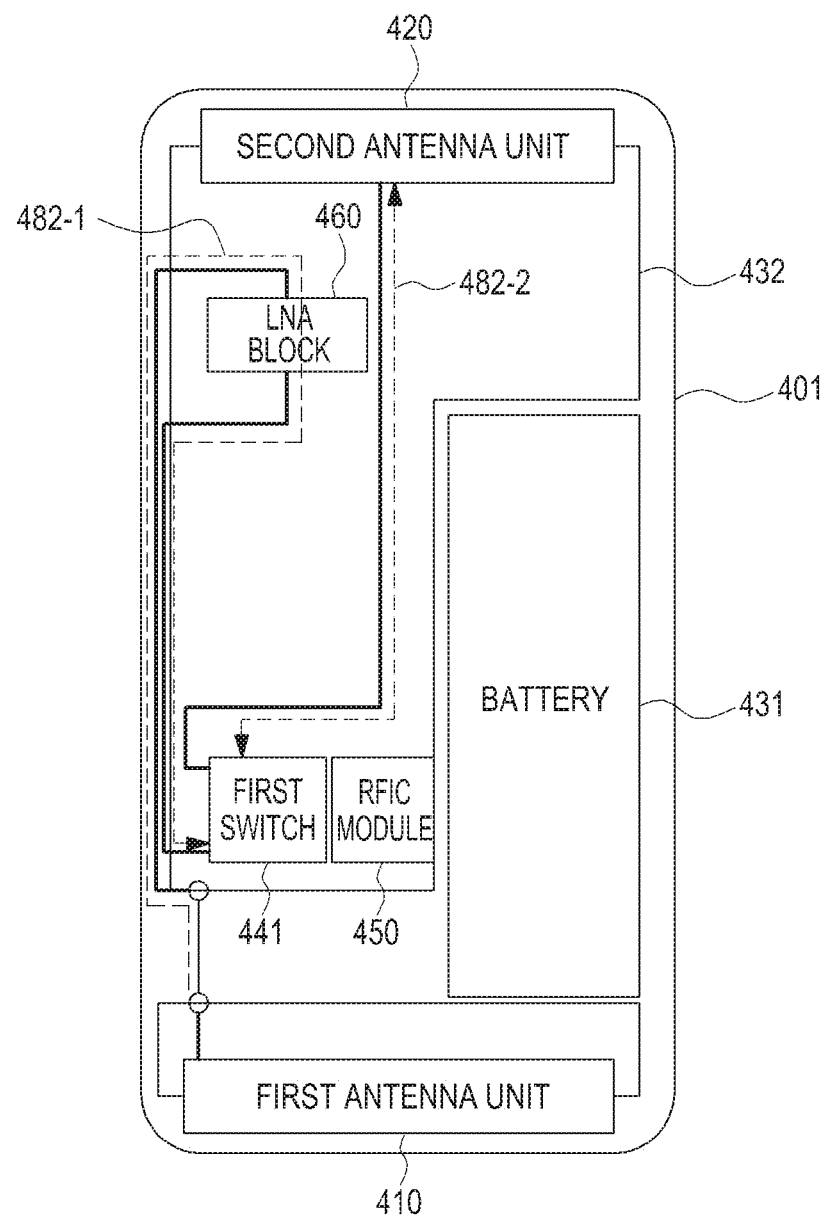
Figure 4C:
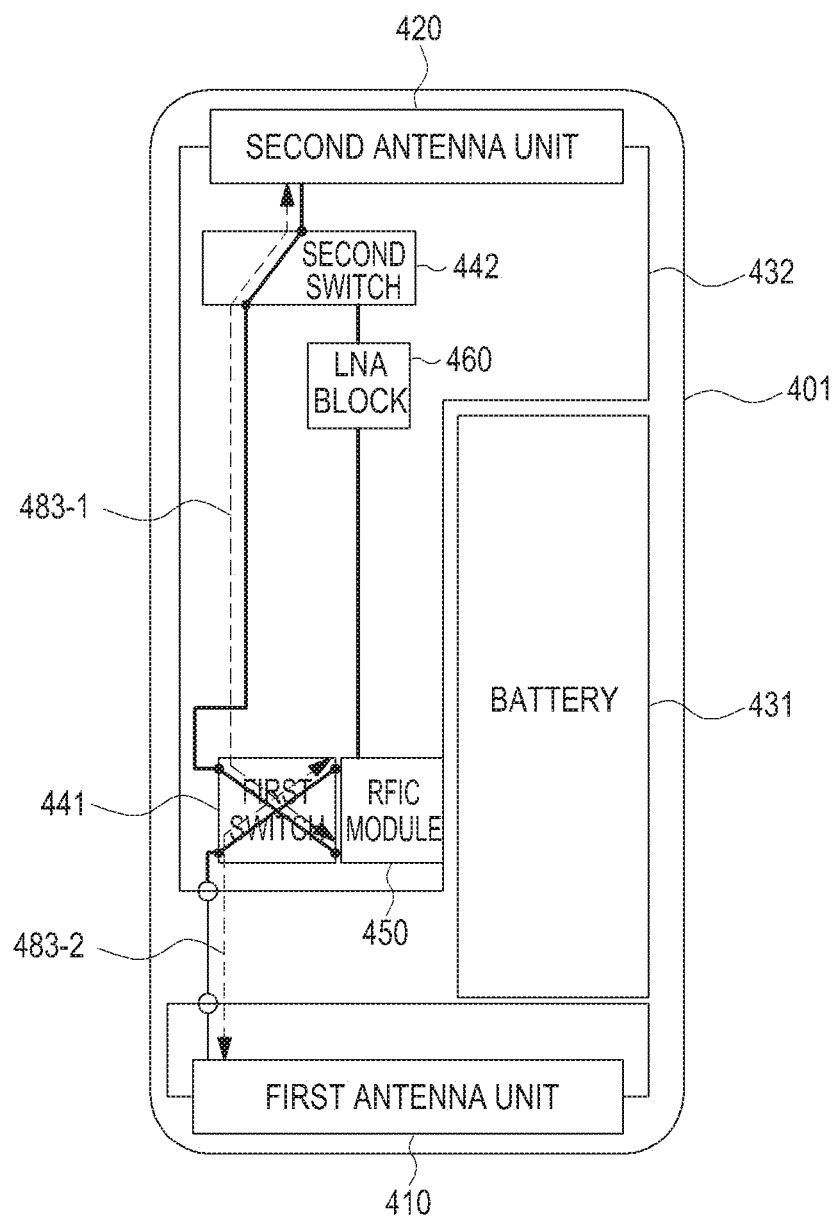

FIGS. 4A to 4C illustrate signal flows along antenna connections of the electronic device according to various embodiments of the present disclosure.

Referring to FIG. 4A, an electronic device 401 may include a first antenna unit 410, a second antenna unit 420, a first switch 441, a second switch 442, an RFIC module 450, and an LNA block 460, and the first switch 441, the second switch 442, the RFIC module 450, and the LNA block 460 may be arranged on a PCB 432. Further, a battery 431 may be arranged on the right side of the PCB 432.

FIG. 4A illustrates a signal flow when the first antenna unit 410 operates as the main antenna of the electronic device 401 and the second antenna unit 420 operates as the sub antenna of the electronic device 401.

Referring to FIG. 4A, a signal received through the second antenna unit 420 may be transferred to the RFIC module 450 via the second switch 442 and the LNA block 460. The LNA block 460 may amplify a reception signal received by the second antenna unit 420 so as to compensate for a loss of a signal strength generated until the reception signal arrives at the RFIC module 450. The LNA block 460 may be disposed close to the second antenna unit 420 and amplify the signal before a large loss of the signal received by the second antenna unit 420 is generated. The second switch 442 may be an interface for connecting the second antenna unit 420 to the first switch 441 or the RFIC module 450. As described above, a path 481-1 in which the signal received by the second antenna unit 420 is transferred to the RFIC module 450 may have an order of "second antenna unit 420→second switch 442→LNA block 460→RFIC module 450".

The signal received by the first antenna unit 410 may be transferred to the RFIC module 450 through the first switch 441. A transmission signal transmitted from the electronic device 401 to another device (for example, electronic device 602 or 604) may be transferred from the RFIC module 450 to the first antenna unit 410 through the first switch 441. The first antenna unit 410 may transmit or broadcast the transmission signal transferred from the RFIC module 450 to another device. As described above, a path 481-2 in which the transmission signal transmitted by the first antenna unit 410 is transferred from the RFIC module 450 to the first antenna unit 410 may have an order of "RFIC module 450→first switch 441→first antenna unit 410". Further, the path 481-2 in which the reception signal received by the first antenna unit 410 is transferred to the RFIC module 450 may have an order of "first antenna unit 410→first switch 441→RFIC module 450".

FIG. 4B illustrates an example of a signal flow when the first antenna unit 410 operates as the sub antenna of the electronic device 401 and the second antenna unit 420 operates as the main antenna of the electronic device 401.

Referring to FIG. 4B, a reception signal received through the first antenna unit 410 may pass through the first switch 441 and then be transferred to the RFIC module 450 via the LNA block 460. As described above, a path 482-1 in which the reception signal received by the first antenna unit 410 is transferred from the RFIC module 450 to the first antenna unit 410 may have an order of "first antenna unit 410→first switch 441→LNA block 460→RFIC module 450".

Further, a reception signal received through the second antenna unit 420 may be transferred from the second antenna unit 420 to the RFIC module 450 via the first switch 441. In addition, a transmission signal transmitted through the second antenna unit 420 may be transferred from the RFIC module 450 to the second antenna unit 420 via the first switch 441, and the second antenna unit 420 may transmit the transmission signal to another device. As described above, a path 482-2 in which the transmission signal transmitted by the second antenna unit 420 is transferred from the RFIC module 450 to the second antenna unit 420 may have an order of "RFIC module 450→first switch 441→second antenna unit 420". Further, the path 482-2 in which the reception signal received by the second antenna unit 420 is transferred to the RFIC module 450 may have an order of "second antenna unit 420→first switch 441→RFIC module 450".

Referring to FIG. 4B, when the first antenna unit 410 is used as the sub antenna, the LNA block 460 may be used to amplify the reception signal received through the first antenna unit 410. However, since a physical distance between the first antenna unit 410 and the LNA block 460 is long, the reception signal received through the first antenna unit 410 may traverse the PCB 432 in a process in which the reception signal is transferred to the LNA block 460 and traverse again the PCB 432 in a process in which the reception signal is transferred from the LNA block 460 to the RFIC module 450. As described above, when the reception signal traverses the PCB 432, the reception signal has a loss.

FIG. 4C illustrates another embodiment of the case where the first antenna unit 410 operates as the sub antenna of the electronic device 401 and the second antenna unit 420 operates as the main antenna of the electronic device 401.

Referring to FIG. 4C, a reception signal received through the first antenna unit 410 may pass through the first switch 441 and then be transferred to the RFIC module 450. A reception signal received through the second antenna unit 420 may be transferred to the RFIC module 450 via the second switch 422 and the first switch 441. A transmission signal transmitted through the second antenna unit 420 may be transferred from the RFIC module 450 to the second antenna unit 420 via the first switch 441 and the second switch 422.

A path 483-2 in which the reception signal received by the first antenna unit 410 is transferred to the RFIC module 450 may have an order of "first antenna unit 410→first switch 441→RFIC module 450". A path 483-1 in which the transmission signal transmitted by the second antenna unit 420 is transferred from the RFIC module 450 to the second antenna unit 420 may have an order of "RFIC module 450→first switch 441→second switch 442→second antenna unit 420". Further, the path 483-1 in which the reception signal received by the second antenna unit 420 is transferred to the RFIC module 450 may have an order of "second antenna unit 420→second switch 442→first switch 441→RFIC module 450".

Referring to FIG. 4C, when the first antenna unit 410 is used as the sub antenna, the reception signal received through the first antenna unit 410 may be directly transferred to the RFIC module 450 without the use of the LNA block 460 since a physical distance between the first antenna unit 410 and the RFIC module 450 is short.

An electronic device according to an embodiment of the present disclosure may include a first antenna; a second antenna; a transmission/reception path unit; a first reception path unit; a second reception path unit including an LNA; a signal path selection unit configured to connect each of the first antenna and the second antenna to the transmission/reception path unit, the first reception path unit, or the second reception path unit; and an RFIC module or a processor including the RFIC module configured to control the signal path selection unit to have a first state in which the first antenna is connected to the transmission/reception path unit and the second antenna is connected to the second reception path unit or control the signal path selection unit to have a second state in which the first antenna is connected to the first reception path unit and the second antenna is connected to the transmission/reception path unit.

Figure 5A:
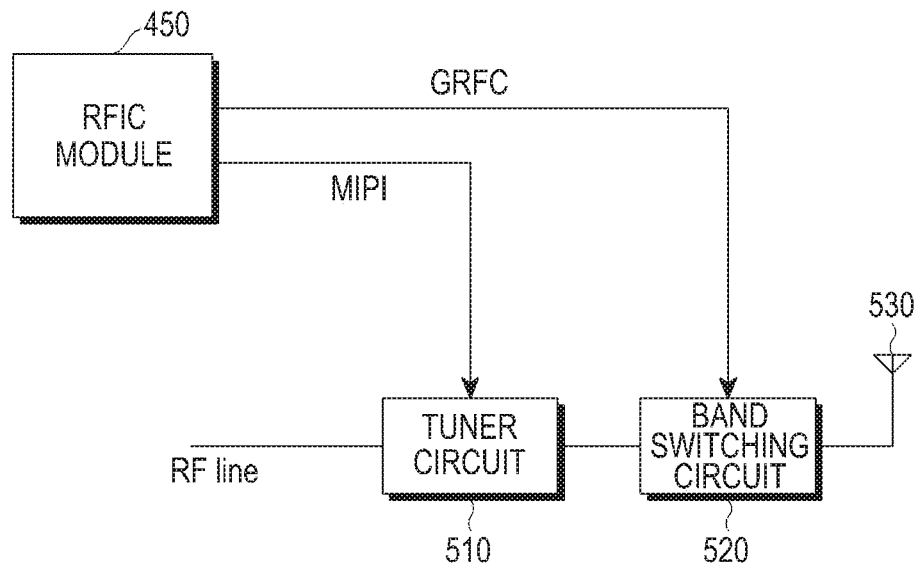
FIGS. 5A to 5C illustrate control blocks which can control frequency bands in the electronic device according to various embodiments of the present disclosure.
Figure 5B:
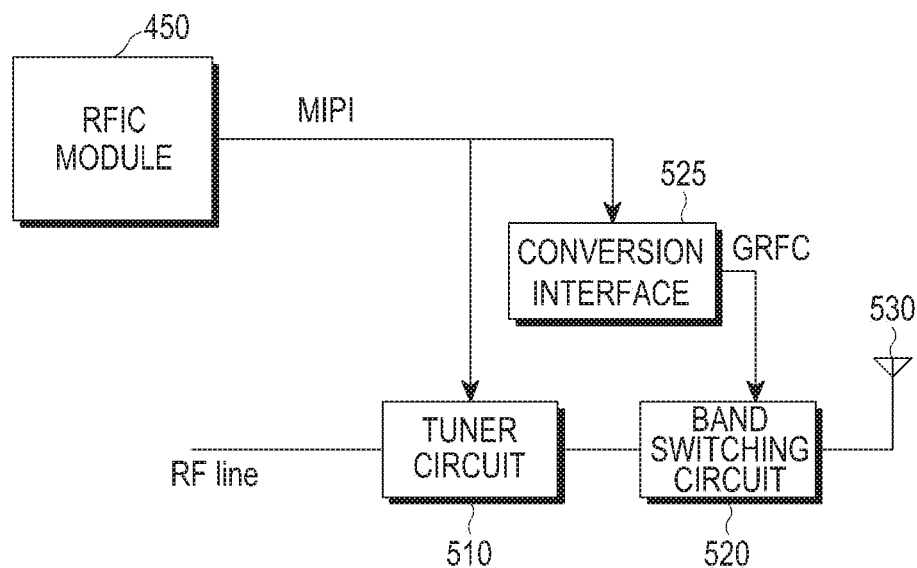
Figure 5C:
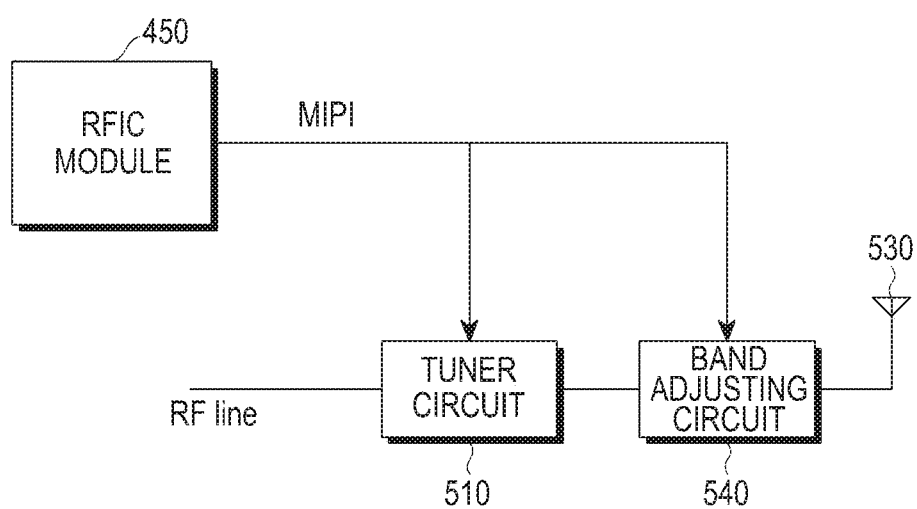

FIGS. 5A to 5C illustrate control blocks which can adjust frequency bands in the electronic device 401 according to various embodiments of the present disclosure.

Referring to FIG. 5A, the RFIC module 450 may transmit a control signal to a tuner circuit 510 and a band switching circuit 520. A radio frequency supported by the antenna may be changed by the tuner circuit 510 or the band switching circuit 520 which is controlled by the RFIC module 450. An antenna 530 may transmit/receive data using a radio frequency which is changed by the tuner circuit 510 or the band switching circuit 520 and supported by the radio frequency.

A mobile industry processor interface (MIPI) may be connected in between the RFIC module 450 and the tuner circuit 510, and thus the RFIC module 450 may transmit a control signal to the tuner circuit 510 through the MIPI. According to an embodiment, the RFIC module 450 may transfer 0 to 20 data values all at once to the tuner circuit 510 by using the MIPI. According to an embodiment, the tuner circuit 510 may tune the frequency. For example, the tuner circuit 510 may control a frequency band lower than 5 MHz. For example, it may be assumed that a frequency to be used through the antenna 530 is 800 MHz and a frequency to be used through the current antenna 530 is 798 MHz. The RFIC module 450 may transmit a control signal to the tuner circuit 510 and adjust the frequency used by the antenna 530 to be 800 MHz.

A general RF control (GRFC) interface may be connected in between the RFIC module 450 and the band switching circuit 520, and thus the RFIC module 450 may transmit a control signal to the band switching circuit 520 through the GRFC interface. According to an embodiment, the number of data values transferred from the RFIC module 450 to the band switching circuit 520 through the GRFC interface may be four. The band switching circuit 520 may determine a frequency band used by the antenna 530 by turning on/off at least one of the switches included in the band switching circuit 520. For example, it is assumed that the frequency used by the antenna 530 is the middle frequency band (1700 to 2100 MHz). The band switching circuit 520 may adjust the frequency used by the antenna 530 to be 1800 MHz, 1900 MHz, 2000 MHz, or 2100 MHz by turning on or off the switches included in the band switching circuit 520 according to the control signal received by the RFIC module 450.

Referring to FIG. 5B, the RFIC module 450 may transmit a control signal to the tuner circuit 510 and the band switching circuit 520. A radio frequency may be determined by the tuner circuit 510 or the band switching circuit 520 which is controlled by the RFIC module 450. The antenna 530 may transmit/receive data by using the radio frequency which is determined by the tuner circuit 510 or the band switching circuit 520.

The MIPI may be connected in between the RFIC module 450 and the tuner circuit 510, and thus the RFIC module 450 may transmit a control signal to the tuner circuit 510 through the MIPI. According to an embodiment, the RFIC module 450 may transfer 0 to 20 data values all at once to the tuner circuit 510 by using the MIPI. According to an embodiment, the tuner circuit 510 may tune the frequency. For example, the tuner circuit 510 may adjust a frequency band lower than 5 MHz. For example, it may be assumed that the frequency to be used through the antenna 530 is 800 MHz and the frequency to be used through the current antenna 530 is 798 MHz. The RFIC module 450 may transmit a control signal to the tuner circuit 510 and adjust the frequency used by the antenna 530 to be 800 MHz.

The MIPI may be also connected in between the RFIC module 450 and a band switching circuit 520, and thus the RFIC module 450 may transmit a control signal to the band adjusting circuit 540 through the MIPI.

According to an embodiment, since the control signal transferred through the MIPI may have 20 data values, a conversion interface 525 may convert the control signal transferred through the MIPI to, for example, a 2-bit value (00, 01, 10, or 11). The band switching circuit 520 may determine a frequency band used by the antenna 530 by turning on/off at least one of the switches included in the band switching circuit 520 according to the control signal converted through the conversion interface 530. For example, it is assumed that the frequency used by the antenna 530 is the middle frequency band (1700 to 2100 MHz). The band switching circuit 520 may adjust the frequency used by the antenna 530 to be 1800 MHz, 1900 MHz, 2000 MHz, or 2100 MHz by turning on or off the switches included in the band switching circuit 520 according to the control signal received by the RFIC module 450.

Referring to FIG. 5C, the RFIC module 450 may transmit a control signal to the tuner circuit 510 and the band adjusting circuit 540. A radio frequency may be determined by the tuner circuit 510 or the band adjusting circuit 540 which is controlled by the RFIC module 450. The antenna 530 may transmit/receive data by using the radio frequency which is determined by the tuner circuit 510 or the band adjusting circuit 540.

The MIPI may be connected in between the RFIC module 450 and the tuner circuit 510, and thus the RFIC module 450 may transmit a control signal to the tuner circuit 510 through the MIPI. According to an embodiment, the RFIC module 450 may transfer 0 to 20 data values all at once to the tuner circuit 510 by using the MIPI. According to an embodiment, the tuner circuit 510 may tune the frequency. It may be assumed that the frequency band, which can be adjusted through the tuner circuit 510, corresponds to, for example, 791 MHz, 792 MHz, 793 MHz, 794 MHz, 795 MHz, 796 MHz, 797 MHz, 798 MHz, 799 MHz, 800 MHz, 801 MHz, 802 MHz, 803 MHz, 804 MHz, 805 MHz, 806 MHz, 807 MHz, 808 MHz, 809 MHz, and 810 MHz. The RFIC module 450 may store table 1 below.

TABLE 1

| Frequency | Control data (binary) |
| --- | --- |
| 791 MHz | 00000 |
| 792 MHz | 00001 |
| 793 MHz | 00010 |
| 794 MHz | 00011 |
| 795 MHz | 00100 |
| 796 MHz | 00101 |
| 797 MHz | 00110 |
| 798 MHz | 00111 |
| 799 MHz | 01000 |
| 800 MHz | 01001 |
| 801 MHz | 01010 |
| 802 MHz | 01011 |
| 803 MHz | 01100 |
| 804 MHz | 01101 |
| 805 MHz | 01110 |
| 806 MHz | 01111 |
| 807 MHz | 10000 |

TABLE 1-continued

| Frequency | Control data (binary) |
|---|---|
| 808 MHz | 10001 |
| 809 MHz | 10010 |
| 810 MHz | 10011 |

The RFIC module 450 may transfer control data for adjusting the frequency band to the tuner circuit 510 based on table 1 above. For example, the tuner circuit 510 may adjust a frequency band lower than 5 MHz. For example, it may be assumed that the frequency to be used through the antenna 530 is 800 MHz and the frequency to be used through the current antenna 530 is 798 MHz. The RFIC module 450 may transmit a control signal, that is, control data 01001 corresponding to 800 MHz to the tuner circuit 510, so as to adjust the frequency used by the antenna 530 to be 800 MHz.

According to an embodiment, the control data transferred from the RFIC module 450 to the tuner circuit 510 or the band adjusting circuit 540 may be a clock signal, and the clock signal may include identification data corresponding each of the tuner circuit 510 and the band adjusting circuit 540. The tuner circuit 510 may detect identification data from the control data and, when the identification data corresponds to the tuner circuit 510, adjust the frequency band of the antenna 530 according to the control data. Similarly, the band adjusting circuit 540 may detect identification data from the control data and, when the identification data corresponds to the band adjusting circuit 540, adjust the frequency band of the antenna 530 according to the control data.

The MIPI may be connected in between the RFIC module 450 and the band adjusting circuit 540, and thus the RFIC module 450 may transmit a control signal to the band adjusting circuit 540 through the MIPI.

According to an embodiment, since the control signal transferred through the MIPI may have 20 data values, the band adjusting circuit 540 may determine the frequency band used by the antenna 530 by operating one or more capacitances included in the band switching circuit 520 according to the control signal transferred through the MIPI. For example, it is assumed that the frequency used by the antenna 530 is the middle frequency band (1700 to 2100 MHz). The band adjusting circuit 540 may adjust the frequency used by the antenna 530 to be 1800 MHz, 1900 MHz, 2000 MHz, or 2100 MHz by operating at least some of the capacitances included in the band adjusting circuit 540 according to the control data received by the RFIC module 450.

Figure 6:
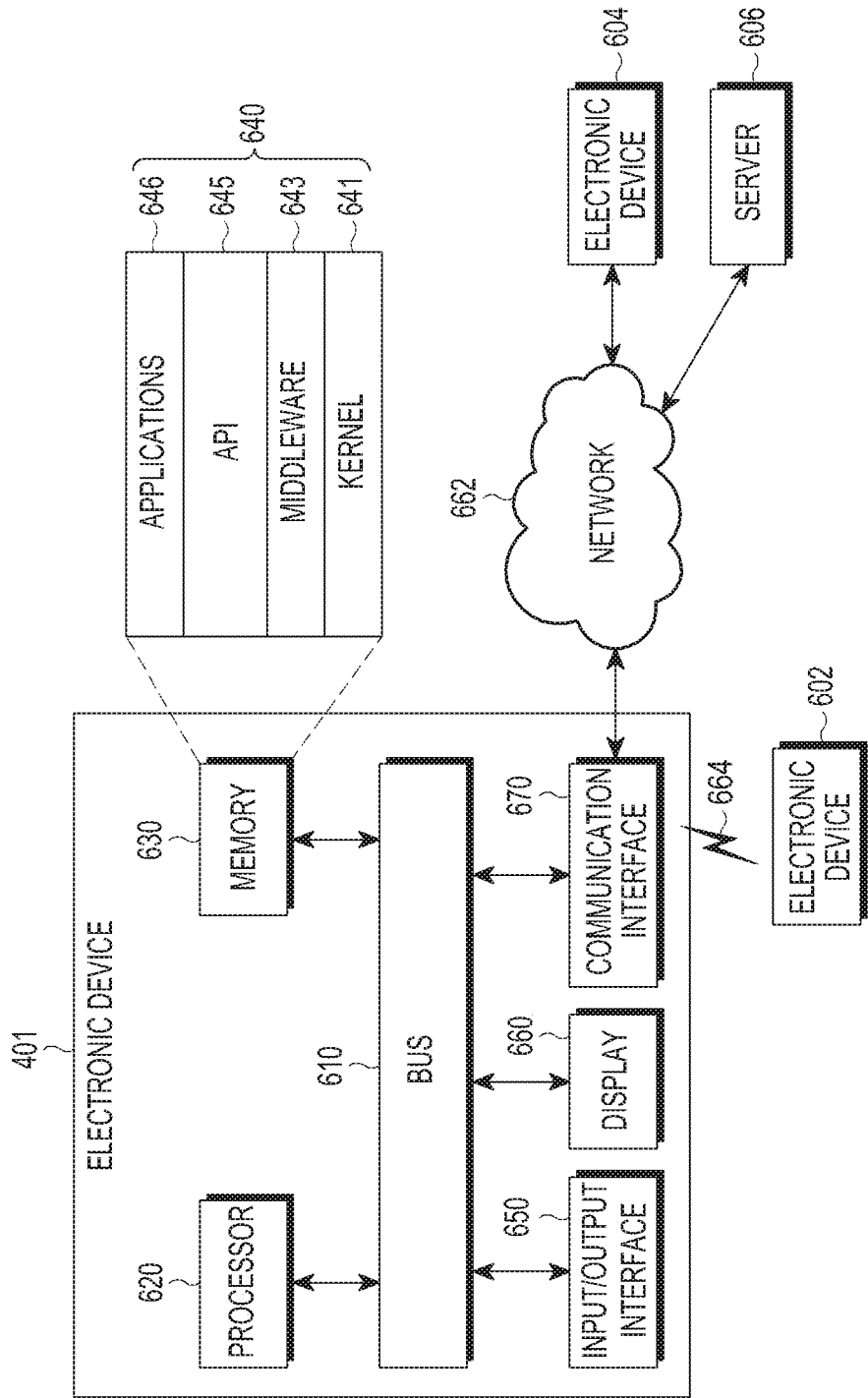
FIG. 6 illustrates the electronic device within a network environment 600 according to various embodiments of the present disclosure.

FIG. 6 illustrates the electronic device 401 within a network environment 600 according to various embodiments of the present disclosure.

The electronic device 401 may include a bus 610, a processor 620, a memory 630, an input/output interface 650, a display 660, and a communication interface 670. In some embodiments, the electronic device 401 may omit at least one of the above elements or additionally include other elements.

The bus 610 may include, for example, a circuit for connecting the elements 620 to 670 and transferring communication (for example, control messages and/or data) between the elements.

The processor 620 may include one or more of a CPU, an AP, and a communication processor (CP). The processor 620 may carry out, for example, operations or data processing relating to control and/or communication of one or more other elements of the electronic device 401. According to an embodiment, the processor 620 may be implemented to include the RFIC module 450 illustrated in FIGS. 4A to 4C.

According to an embodiment, the processor 620 may control a connection and use of the antenna. The processor 620 may determine an operation of the first antenna unit 410 or the second antenna unit 420 according to a current state of each of the first antenna unit 410 and the second antenna unit 420 illustrated in FIGS. 4A to 4C. For example, it is assumed that the first antenna unit 410 may transmit/receive a voice or data as the main antenna of the electronic device 401 and the second antenna unit 420 may receive a voice or data as the sub antenna of the electronic device 401. When the operation of the first antenna unit 410 is not smooth, for example, when an signal-to-noise ratio (SNR) of the first antenna unit 410 is smaller than a preset value, when transmission power of the first antenna unit 410, which is being transmitted through the first antenna unit 410, is insufficient, when a difference between reception power of the second antenna unit 420 and reception power of the first antenna unit 410 is larger than or equal to a preset threshold, when a reflection loss of a signal transmitted through the first antenna unit 410 is larger than or equal to a preset value, or when jamming is generated in the first antenna unit 410, the processor 620 may switch the first antenna unit 410 to the sub antenna and the second antenna unit 420 to the main antenna.

The memory 630 may include a volatile memory and/or a non-volatile memory. The memory 630 may store, for example, instructions or data relevant to at least one other element of the electronic device 401.

According to an embodiment, the memory 630 may store a look-up table (for example, Table 1) for controlling the operations of the first antenna unit 410 and the second antenna unit 420 illustrated in FIGS. 4A to 4C, for example, control data for controlling the operation of the tuner circuit 510, the band switching circuit 520, or the band adjusting circuit 540 illustrated in FIGS. 5A to 5C in a look-up table form.

According to an embodiment, the memory 630 may store software and/or a program 640. The program 640 may include, for example, a kernel 641, middleware 643, an application programming interface (API) 645, and/or application programs (or "applications") 646. At least some of the kernel 641, the middleware 643, and the API 645 may be referred to as an operating system (OS).

The kernel 641 may control or manage system resources (for example, the bus 610, the processor 620, or the memory 630) used for performing an operation or function implemented by the other programs (for example, the middleware 643, the API 645, or the application programs 646). Furthermore, the kernel 641 may provide an interface through which the middleware 643, the API 645, or the application programs 646 may access the individual elements of the electronic device 401 to control or manage the system resources.

The middleware 643 may function as, for example, an intermediary for allowing the API 645 or the application programs 646 to communicate with the kernel 641 to exchange data.

In addition, the middleware 643 may process one or more task requests received from the application programs 646 according to priorities thereof. For example, the middleware 643 may assign priorities for using the system resources (for example, the bus 610, the processor 620, the memory 630, or the like) of the electronic device 401, to at least one of the application programs 646. For example, the middleware 643 may perform scheduling or load balancing on the one or more task requests by processing the one or more task requests according to the priorities assigned thereto.

The API 645 is an interface through which the applications 646 control functions provided from the kernel 641 or the middleware 643, and may include, for example, at least one interface or function (for example, instruction) for file control, window control, image processing, or text control.

The input/output interface 650 may function as, for example, an interface that may transfer instructions or data input from a user or another external device to the other element(s) of the electronic device 401. Furthermore, the input/output interface 650 may output the instructions or data received from the other element(s) of the electronic device 401 to the user or another external device.

The display 660 may include, for example, a liquid crystal display (LCD), a light-emitting diode (LED) display, an organic LED (OLED) display, a microelectromechanical systems (MEMS) display, and an electronic paper display. The display 660 may display, for example, various types of content (for example, text, images, videos, icons, or symbols) for the user. The display 660 may include a touch screen and receive, for example, a touch, gesture, proximity, or hovering input using an electronic pen or the user's body part.

The communication interface 670 may set communication between, for example, the electronic device 401 and an external device (for example, the first external electronic device 602, the second external electronic device 604, or the server 606). For example, the communication interface 670 may be connected to a network 662 through wireless or wired communication to communicate with the external device (for example, the second external electronic device 604 or the server 606).

The wireless communication may use at least one of, for example, long term evolution (LTE), LTE-advanced (LTE-A), code division multiple access (CDMA), wideband CDMA (WCDMA), universal mobile telecommunications system (UMTS), wireless broadband (WiBro), and global system for mobile communications (GSM), as a cellular communication protocol. In addition, the wireless communication may include, for example, short-range communication 664. The short-range communication 664 may be performed by using at least one of, for example, Wi-Fi, Bluetooth, near field communication (NFC), and global navigation satellite system (GNSS). The GNSS may include at least one of, for example, a GPS, a global navigation satellite system (Glonass), a Beidou navigation satellite system (hereinafter, referred to as "Beidou"), and Galileo (European global satellite-based navigation system) according to an area in which the GNSS is used or a bandwidth of the GNSS. Hereinafter, in the present disclosure, the term "GPS" may be interchangeably used with the term "GNSS". The wired communication may include at least one of, for example, a universal serial bus (USB), a high definition multimedia interface (HDMI), recommended standard 232 (RS-232), and a plain old telephone service (POTS). The network 162 may include at least one of communication networks such as a computer network (for example, a local area network (LAN) or a wireless area network (WAN)), the Internet, and a telephone network.

Each of the first and second external electronic devices 602 and 604 may be a device which is the same as or different from the electronic device 401. According to an embodiment, the server 606 may include a group of one or more servers. According to various embodiments, all or some of the operations performed by the electronic device 401 may be performed by another electronic device or a plurality of electronic devices (for example, the electronic device 602 or 604 or the server 606). According to an embodiment, when the electronic device 401 has to perform some functions or services automatically or in response to a request, the electronic device 401 may make a request for performing at least some functions relating thereto to another device (for example, the electronic device 602 or 604 or the server 606) instead of performing the functions or services by itself or in addition. Another electronic apparatus (for example, the electronic device 602 or 604, or the server 606) may execute the requested functions or the additional functions, and may deliver a result of the execution to the electronic apparatus 401. The electronic device 401 may process the received result as it is or additionally to provide the requested functions or services. To achieve this, for example, cloud computing, distributed computing, or client-server computing technology may be used.

Figure 7:
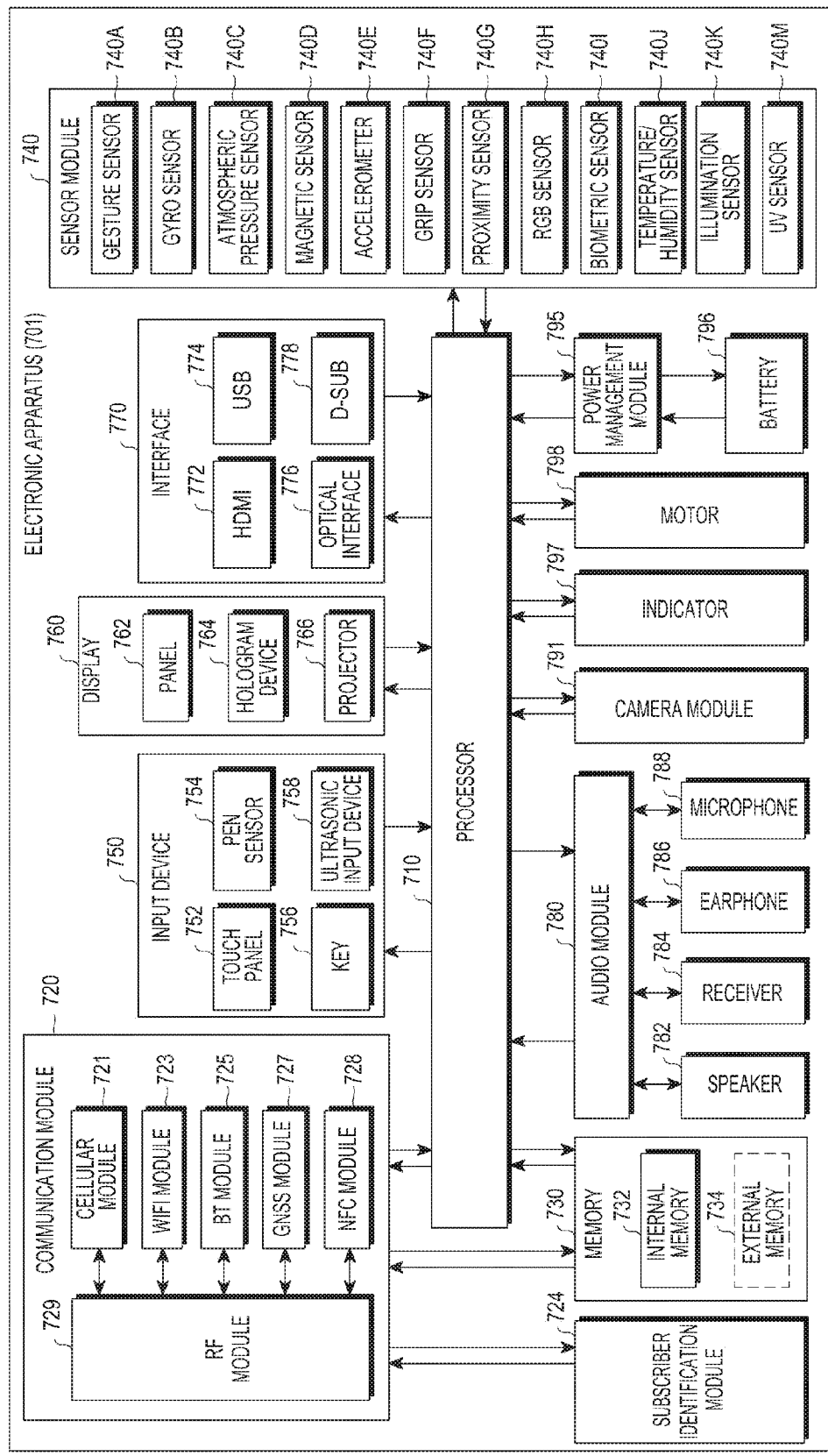
FIG. 7 is a block diagram of the electronic device according to various embodiments of the present disclosure.

FIG. 7 is a block diagram of an electronic device 701 according to various embodiments of the present disclosure.

The electronic device 701 may include, for example, all or part of the electronic device 401 illustrated in FIG. 6. The electronic apparatus 701 may include at least one processor (e.g., an AP) 710, a communication module 720, a subscriber identification module (SIM) 724, a memory 730, a sensor module 740, an input device 750, a display 760, an interface 770, an audio module 780, a camera module 791, a power management module 795, a battery 796, an indicator 797, and a motor 798.

The processor 710 may control multiple hardware or software elements connected to the processor 710 by running, for example, an OS or an application program, and may perform processing of and arithmetic operations on various data. The processor 710 may be implemented by, for example, a system on chip (SoC). According to an embodiment, the processor 710 may further include a graphics processing unit (GPU) and/or an image signal processor (ISP). The processor 710 may also include at least some (for example, a communication interface 670) of the elements illustrated in FIG. 6. The processor 710 may load, into a volatile memory, instructions or data received from at least one (for example, a non-volatile memory) of the other elements and may process the loaded instructions or data, and may store various data in a non-volatile memory.

The communication module 720 may have a configuration equal or similar to that of the communication interface 670 of FIG. 6. The communication module 720 may include, for example, a cellular module 721, a Wi-Fi module 723, a Bluetooth module 725, a GNSS module 727 (for example, a GPS module, a Glonass module, a Beidou module, or a Galileo module), an NFC module 728, and a radio frequency (RF) module 729.

According to an embodiment, each of the cellular module 721, the Wi-Fi module 723, the Bluetooth module 725, the GNSS module 727 (for example, the GPS module, Glonass module, Beidou module, or Galileo module), the NFC module 728, and the RF module 729 may be implemented to be included in the first antenna unit 410 or the second antenna unit 420.

The cellular module 721 may provide a voice call, an image call, a text message service, or an Internet service through, for example, a communication network. According to an embodiment, the cellular module 721 may identify and authenticate the electronic device 701 within a communication network using a SIM (for example, the SIM card 724). According to an embodiment, the cellular module 721 may perform at least some of the functions that the processor 710 may provide. According to an embodiment, the cellular module 721 may include a CP.

The Wi-Fi module 723, the Bluetooth module 725, the GNSS module 727, or the NFC module 728 may include, for example, a processor that processes data transmitted and received through the corresponding module. According to some embodiments, at least some (for example, two or more) of the cellular module 721, the Wi-Fi module 723, the Bluetooth module 725, the GNSS module 727, and the NFC module 728 may be included in one integrated chip (IC) or IC package.

The RF module 729 may transmit/receive, for example, a communication signal (for example, an RF signal). The RF module 729 may include, for example, a transceiver, a power amp module (PAM), a frequency filter, a LNA, or an antenna. According to another embodiment of the present disclosure, at least one of the cellular module 721, the Wi-Fi module 723, the Bluetooth module 725, the GNSS module 727, and the NFC module 728 may transmit and receive RF signals through a separate RF module. According to an embodiment, the RF module 729 may be implemented to include the RFIC module 450.

The SIM 724 may include, for example, a card including a SIM and/or an embedded SIM, and may contain unique identification information (for example, an integrated circuit card identifier (ICCID)) or subscriber information (for example, an international mobile subscriber identity (IMSI)).

The memory 730 (for example, the memory 630) may include, for example, an internal memory 732 or an external memory 734. The internal memory 732 may include at least one of a volatile memory (for example, a dynamic random access memory (DRAM), a static RAM (SRAM), a synchronous dynamic RAM (SDRAM), and the like) and a non-volatile memory (for example, a one time programmable read only memory (OTPROM), a programmable ROM (PROM), an erasable and programmable ROM (EPROM), an electrically erasable and programmable ROM (EEPROM), a mask ROM, a flash ROM, a flash memory (for example, a NAND flash memory or a NOR flash memory), a hard disk drive, a solid state drive (SSD), and the like).

The external memory 734 may further include a flash drive, for example, a compact flash (CF), a secure digital (SD), a micro-SD, a mini-SD, an eXtreme digital (xD), a memory stick, or the like. The external memory 734 may be functionally and/or physically connected to the electronic device 401 through various interfaces.

The sensor module 740 may measure a physical quantity or detect an operation state of the electronic device 701, and may convert the measured or detected information into an electrical signal. The sensor module 740 may include, for example, at least one of a gesture sensor 740A, a gyro sensor 740B, an atmospheric pressure sensor 740C, a magnetic sensor 740D, an acceleration sensor 740E, a grip sensor 740F, a proximity sensor 740G, a color sensor 740H (for example, a red, green, blue (RGB) sensor), a biometric sensor 740I, a temperature/humidity sensor 740J, a light sensor 740K, and a ultraviolet (UV) sensor 740M. Additionally or alternatively, the sensor module 740 may include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 740 may further include a control circuit for controlling one or more sensors included therein. In some embodiments, the electronic device 701 may further include a processor configured to control the sensor module 740 as a part of or separately from the processor 710, and may control the sensor module 740 while the processor 710 is in a sleep state.

According to an embodiment, the grip sensor 740F or the proximity sensor 740G may be used to determine whether the operation of the antenna of the electronic device (for example, the first antenna unit 410 or the second antenna unit 420) is interrupted by the user. For example, it may be assumed that the user grips the first antenna unit 410 or a location of the electronic device 701 close to the first antenna unit 410. Further, it may be assumed that the first antenna unit 410 operates as the main antenna of the electronic device 701. The proximity sensor 740G may detect a user's hand approaching the first antenna unit 410 of the electronic device 701, and the grip sensor 740F may detect a user's hand gripping the first antenna unit 410 of the electronic device 701. Accordingly, the processor 710 may switch the main antenna from the first antenna unit 410 to the second antenna unit 420.

The input device 750 may include, for example, a touch panel 752, a (digital) pen sensor 754, a key 756, and an ultrasonic input unit 758. The touch panel 752 may use at least one of, for example, a capacitive type, a resistive type, an infrared type, and an ultrasonic type. Also, the touch panel 752 may further include a control circuit. The touch panel 752 may further include a tactile layer and provide a tactile reaction to the user.

The (digital) pen sensor 754 may include, for example, a recognition sheet which is a part of the touch panel or is separated from the touch panel. The key 756 may include, for example, a physical button, an optical key or a keypad. The ultrasonic input device 758 may detect ultrasonic waves generated by an input tool through a microphone (for example, a microphone 788) and identify data corresponding to the detected ultrasonic waves.

The display 760 (for example, the display 660) may include a panel 762, a hologram device 764 or a projector 766. The panel 762 may include a configuration identical or similar to that of the display 660 illustrated in FIG. 6. The panel 762 may be implemented to be, for example, flexible, transparent, or wearable. The panel 762 and the touch panel 752 may be implemented as one module. The hologram 764 may show a three dimensional image in the air by using an interference of light. The projector 766 may display an image by projecting light onto a screen. The screen may be located, for example, inside or outside the electronic device 701. According to an embodiment, the display 760 may further include a control circuit for controlling the panel 762, the hologram device 764, or the projector 766.

The interface 770 may include, for example, a HDMI 772, a USB 774, an optical interface 776, or a D-subminiature (D-sub) 778. The interface 770 may be included in, for example, the communication interface 670 illustrated in FIG. 6. Additionally or alternatively, the interface 770 may include, for example, a mobile high-definition link (MHL) interface, a SD card/multi-media card (MMC) interface, or an infrared data association (IrDA) standard interface.

The audio module 780 may bilaterally convert, for example, a sound and an electrical signal. At least some elements of the audio module 780 may be included in, for example, the input/output interface 650 illustrated in FIG. 6. The audio module 780 may process sound information which is input or output through, for example, a speaker 782, a receiver 784, earphones 786, the microphone 788 or the like.

The camera module 791 is a device which may photograph a still image and a dynamic image. According to an embodiment, the camera module 791 may include one or more image sensors (for example, a front sensor or a back sensor), a lens, an ISP or a flash (for example, LED or xenon lamp).

The power management module 795 may manage, for example, power of the electronic device 701. According to an embodiment, the power management module 795 may include a power management integrated circuit (PMIC), a charger IC, or a battery or fuel gauge. The PMIC may have a wired and/or wireless charging scheme. Examples of the wireless charging method may include, for example, a magnetic resonance method, a magnetic induction method, an electromagnetic method, and the like. Additional circuits (e.g., a coil loop, a resonance circuit, a rectifier, etc.) for wireless charging may be further included. The battery gauge may measure, for example, a residual quantity of the battery 796, and a voltage, a current, or a temperature during the charging. The battery 796 may include, for example, a rechargeable battery or a solar battery.

The indicator 797 may display a particular state (for example, a booting state, a message state, a charging state, or the like) of the electronic device 701 or a part (for example, the processor 710) of the electronic device 201. The motor 798 may convert an electrical signal into mechanical vibration, and may generate vibration, a haptic effect, or the like. Although not illustrated, the electronic device 701 may include a processing unit (for example, a GPU) for supporting mobile TV. The processing unit for supporting mobile TV may process, for example, media data according to a certain standard such as digital multimedia broadcasting (DMB), digital video broadcasting (DVB), or mediaFlo™.

Each of the above-described component elements of hardware according to the present disclosure may be configured with one or more components, and the names of the corresponding component elements may vary based on the type of electronic device. In various embodiments of the present disclosure, the electronic device may include at least one of the above-described elements, and may exclude some of the elements or further include other additional elements. Further, some of the components of the electronic device according to the various embodiments of the present disclosure may be combined to form a single entity, and thus, may equivalently execute functions of the corresponding elements prior to the combination.

Figure 8:
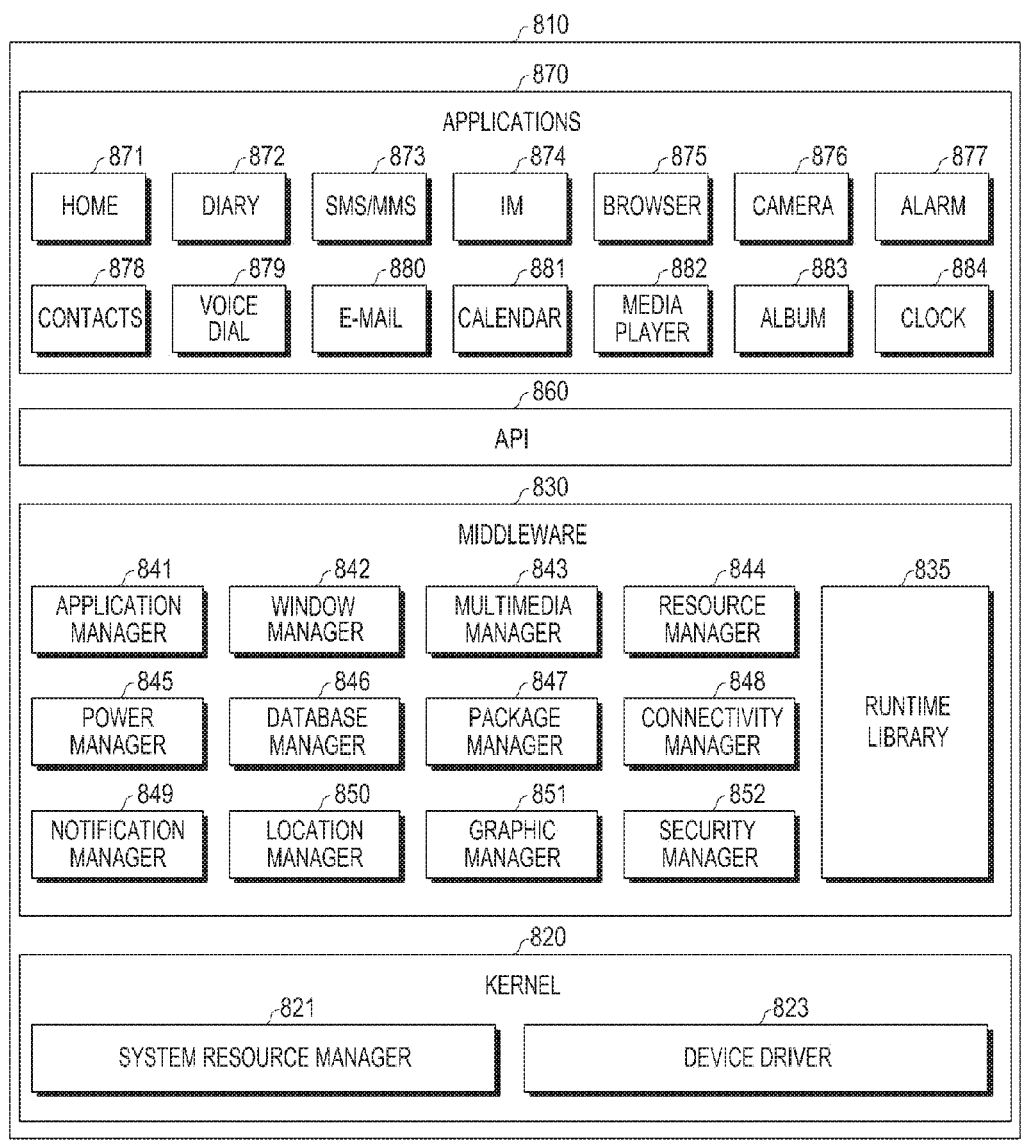
FIG. 8 is a block diagram of a program module according to various embodiments of the present disclosure.

FIG. 8 is a block diagram of a program module according to various embodiments of the present disclosure.

According to an embodiment, the program module 810 (for example, the program 640) may include an OS for controlling resources related to the electronic device (for example, the electronic device 401) and/or various applications (for example, the application programs 646) executed in the OS. The OS may be, for example, Android, iOS, Windows, Symbian, Tizen, Bada, or the like.

The program module 810 may include a kernel 820, middleware 830, an API 860, and/or applications 870. At least some of the program module 810 may be preloaded on the electronic device, or may be downloaded from an external electronic device (for example, the electronic device 602 or 604, or the server 606).

The kernel 820 (for example, the kernel 641) may include, for example, a system resource manager 821 and/or a device driver 823. The system resource manager 821 may control, allocate, or collect system resources. According to an embodiment, the system resource manager 821 may include a process manager, a memory manager, a file system manager, or the like. The device driver 823 may include, for example, a display driver, a camera driver, a Bluetooth driver, a shared memory driver, a USB driver, a keypad driver, a Wi-Fi driver, an audio driver, or an inter-process communication (IPC) driver.

The middleware 830 may provide a function used by the applications 870 in common or provide various functions to the applications 870 through the API 860 so that the applications 870 may efficiently use limited system resources within the electronic device. According to an embodiment, the middleware 830 (for example, the middleware 643) may include, for example, at least one of a runtime library 835, an application manager 841, a window manager 842, a multimedia manager 843, a resource manager 844, a power manager 845, a database manager 846, a package manager 847, a connectivity manager 848, a notification manager 849, a location manager 850, a graphic manager 851, and a security manager 852.

The runtime library 835 may include a library module which a compiler uses in order to add a new function through a programming language while the applications 870 are being executed. The runtime library 835 may perform input/output management, memory management, the functionality for an arithmetic function, or the like.

The application manager 841 may manage, for example, a life cycle of at least one of the applications 870. The window manager 842 may manage graphical user interface (GUI) resources used for the screen. The multimedia manager 843 may determine a format used to reproduce various media files, and may encode or decode a media file using a coder/decoder (codec) appropriate for the corresponding format. The resource manager 844 may manage resources, such as a source code, a memory, a storage space, and the like of at least one of the applications 870.

The power manager 845 may operate together with, for example, a basic input/output system (BIOS), and may manage a battery or power, and may provide power information and the like used for an operation of the electronic apparatus. The database manager 846 may generate, search for, and/or change a database to be used by at least one of the applications 870. The package manager 847 may manage the installation or update of an application distributed in the form of a package file.

The connectivity manager 848 may manage a wireless connection such as, for example, Wi-Fi or Bluetooth. The notification manager 849 may display or notify the user in such a manner so as not to cause a disturbance of an event, such as an arrival message, an appointment, a proximity notification, and the like. The location manager 850 may manage location information of the electronic device. The graphic manager 851 may manage a graphic effect, which is to be provided to the user, or a user interface related to the graphic effect. The security manager 852 may provide various security functions used for system security, user authentication, and the like. According to an embodiment, when the electronic device (for example, the electronic device 401) has a telephone call function, the middleware 830 may further include a telephony manager for managing a voice call function or a video call function of the electronic device.

The middleware 830 may include a middleware module that forms a combination of various functions of the above-described elements. The middleware 830 can provide modules specialized according to types of OSs in order to provide differentiated functions. In addition, the middleware 830 may dynamically remove the elements of the related art, or add new elements.

The API 860 (for example, the API 645) is, for example, a set of API programming functions, and may be provided with a different configuration according to an OS. For example, with respect to each platform, one API set may be provided in a case of Android or iOS, and two or more API sets may be provided in a case of Tizen.

The applications 870 (for example, the application programs 646) may include, for example, one or more applications which can provide functions such as home 871, diary 872, short messaging service (SMS)/multimedia messaging service (MMS) 873, instant message (IM) 874, browser 875, camera 876, alarm 877, contacts 878, voice dial 879, email 880, calendar 881, media player 882, album 883, clock 884, health care (for example, measure exercise quantity or blood sugar), or environment information (for example, atmospheric pressure, humidity, or temperature information).

According to an embodiment, the applications 870 may include an application (hereinafter, referred to as an "information exchange application" for convenience of description) supporting information exchange between the electronic device (for example, the electronic device 401) and an external electronic device (for example, the electronic device 602 or 604). The information exchange application may include, for example, a notification relay application for transferring specific information to an external electronic device or a device management application for managing an external electronic device.

For example, the notification relay application may include a function of transferring, to the external electronic device (for example, the electronic device 602 or 604), notification information generated from other applications of the electronic device 101 (for example, an SMS/MMS application, an e-mail application, a health management application, or an environmental information application). Further, the notification relay application may receive notification information from, for example, an external electronic device and provide the received notification information to a user.

The device management application may manage (for example, install, delete, or update), for example, a function for at least a part of the external electronic device (for example, the electronic device 602 or 604) communicating with the electronic device (for example, turning on/off the external electronic device itself (or some elements thereof) or adjusting brightness (or resolution) of a display), applications executed in the external electronic device, or services provided from the external electronic device (for example, a telephone call service or a message service).

According to an embodiment, the applications 870 may include applications (for example, a health care application of a mobile medical appliance or the like) designated according to attributes of the external electronic device 602 or 604. According to an embodiment, the applications 870 may include an application received from the external electronic device (for example, the server 606, or the electronic device 602 or 604). According to an embodiment, the applications 870 may include a preloaded application or a third party application which can be downloaded from the server. Names of the elements of the program module 810, according to the above-described embodiments of the present disclosure, may change depending on the type of OS.

According to various embodiments of the present disclosure, at least some of the program module 810 may be implemented in software, firmware, hardware, or a combination of two or more thereof. At least some of the program module 810 may be implemented (e.g., executed) by, for example, the processor (e.g., the processor 620). At least some of the program module 510 may include, for example, a module, a program, a routine, a set of instructions, and/or a process for performing one or more functions.

The term "module" used in the present disclosure may refer to, for example, a unit including one or more combinations of hardware, software, and firmware. The "module" may be interchangeable with a term, such as a unit, a logic, a logical block, a component, or a circuit. The "module" may be the smallest unit of an integrated component or a part thereof. The "module" may be a minimum unit for performing one or more functions or a part thereof. The "module" may be mechanically or electronically implemented. For example, the "module" according to the present disclosure may include at least one of an application-specific integrated circuit (ASIC) chip, a field-programmable gate arrays (FPGA), and a programmable-logic device for performing operations which has been known or are to be developed hereinafter.

According to various embodiments, at least some of the devices (for example, modules or functions thereof) or the method (for example, operations) according to the present disclosure may be implemented by a command stored in a computer-readable storage medium in a programming module form. The instruction, when executed by a processor (e.g., the processor 320), may cause the one or more processors to execute the function corresponding to the instruction. The computer-readable storage medium may be, for example, the memory 130.

The computer readable recoding medium may include a hard disk, a floppy disk, magnetic media (for example, a magnetic tape), optical media (for example, a compact disc ROM (CD-ROM) and a DVD), magneto-optical media (for example, a floptical disk), a hardware device (for example, a ROM, a RAM, a flash memory), and the like. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

The programming module according to the present disclosure may include one or more of the aforementioned components or may further include other additional components, or some of the aforementioned components may be omitted. Operations executed by a module, a programming module, or other component elements according to various embodiments of the present disclosure may be executed sequentially, in parallel, repeatedly, or in a heuristic manner. Furthermore, some operations may be executed in a different order or may be omitted, or other operations may be added. Various embodiments disclosed herein are provided merely to easily describe technical details of the present disclosure and to help the understanding of the present disclosure, and are not intended to limit the scope of the present disclosure. Accordingly, the scope of the present disclosure should be construed as including all modifications or various other embodiments based on the technical idea of the present disclosure.

Figure 9:
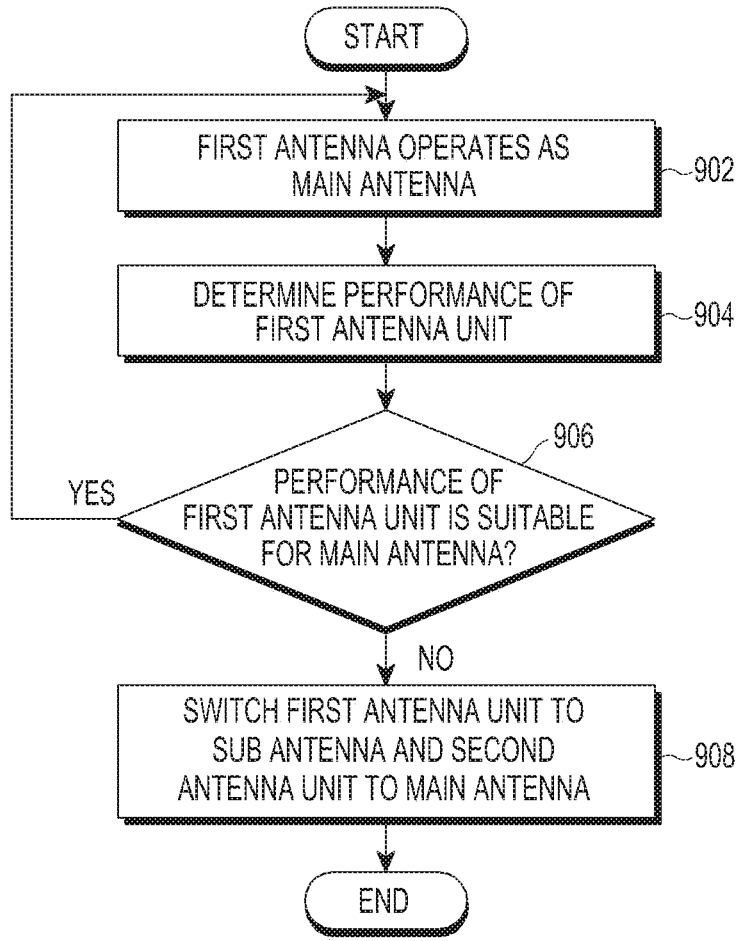
FIG. 9 is a flowchart illustrating a method of controlling operations of antennas by the electronic device according to various embodiments of the present disclosure.

FIG. 9 is a flowchart illustrating a method of controlling antennas of the electronic device 401 according to various embodiments of the present disclosure.

Referring to FIG. 9, the first antenna unit 410 may operate as the main antenna in the electronic device 401 in operation 902. The processor 620 or the RFIC module 450 may determine the performance of the first antenna unit 410 in real time in operation 904. The performance of the first antenna unit 410 may be determined by an SNR of a signal received by the first antenna unit 410, whether transmission power is insufficient when the first antenna unit 410 is used, and a difference between reception power of the second antenna unit 420 and reception power of the first antenna unit 410. For example, the processor 620 or the RFIC module 450 may measure power of a transmission signal transmitted through the first antenna 410 and power of a reflecting incoming signal, which is not transmitted to another device (for example, the electronic device 602 or 604) and returns to the first antenna 410, among transmission signals in real time. The processor 620 or the RFIC module 450 may determine the performance of the first antenna 410, for example, a reflection loss rate by calculating a ratio between the transmission signal and the reflected signal.

The RFIC module 450 or the processor 620 may determine whether the performance of the antenna unit 410 is suitable for the main antenna in operation 906. According to an embodiment, when the reflection loss of the first antenna unit 410 is equal to or larger than a preset reference value, the RFIC module 450 or the processor 620 may determine that the use of the first antenna unit 410 is not suitable for the main antenna. According to another embodiment, when the SNR of the signal received by the first antenna unit is equal or smaller than a preset reference value, when the difference between the reception power of the second antenna unit 420 and the reception power of the first antenna unit 410 is larger than or equal to a preset threshold, or when the transmission power is insufficient when the signal is transmitted through the first antenna unit 410, the RFIC module 450 or the processor 620 may determine that the first antenna unit 410 is not suitable for the main antenna.

Further, when the electronic device 401 transmits a signal with power larger than or equal to a threshold or when the electronic device 401 receives an instruction (for example, transmit power control (TPC+)) (or request) to increase transmission power from another electronic device (for example, the electronic device 602 or 604) while transmitting the signal with power larger than or equal to the threshold, the RFIC module 450 or the processor 620 may determine that the transmission power of the first antenna unit 410 is not sufficient and, accordingly, determine that the first antenna unit 410 is not suitable for the main antenna.

When it is determined that the first antenna unit 410 is not suitable for the main antenna based on a result of the determination of operation 906 (906: No), the processor 620 or the RFIC module 450 may switch the first antenna unit 410 to the sub antenna and switch the second antenna unit 420 to the main antenna in operation 908.

When it is determined that the first antenna unit 410 is suitable for the main antenna based on a result of the determination of operation 906 (906: Yes), the processor 620 or the RFIC module 450 may maintain the first antenna unit 410 as the main antenna in operation 902.

A method for controlling antennas of an electronic device according to an embodiment of the present disclosure may include: if a first antenna operates as a main antenna and a second antenna operates as a sub antenna, determining performance of the first antenna corresponding to the main antenna; determining whether the performance of the first antenna is suitable for the main antenna; and maintaining or switching the main antenna and the sub antenna based on a result of the determination, wherein maintaining or switching the main antenna and the sub antenna comprises connecting each of the first antenna and the second antenna to a transmission/reception path unit, a first reception path unit, or a second reception path unit including an LNA.

Figure 10:
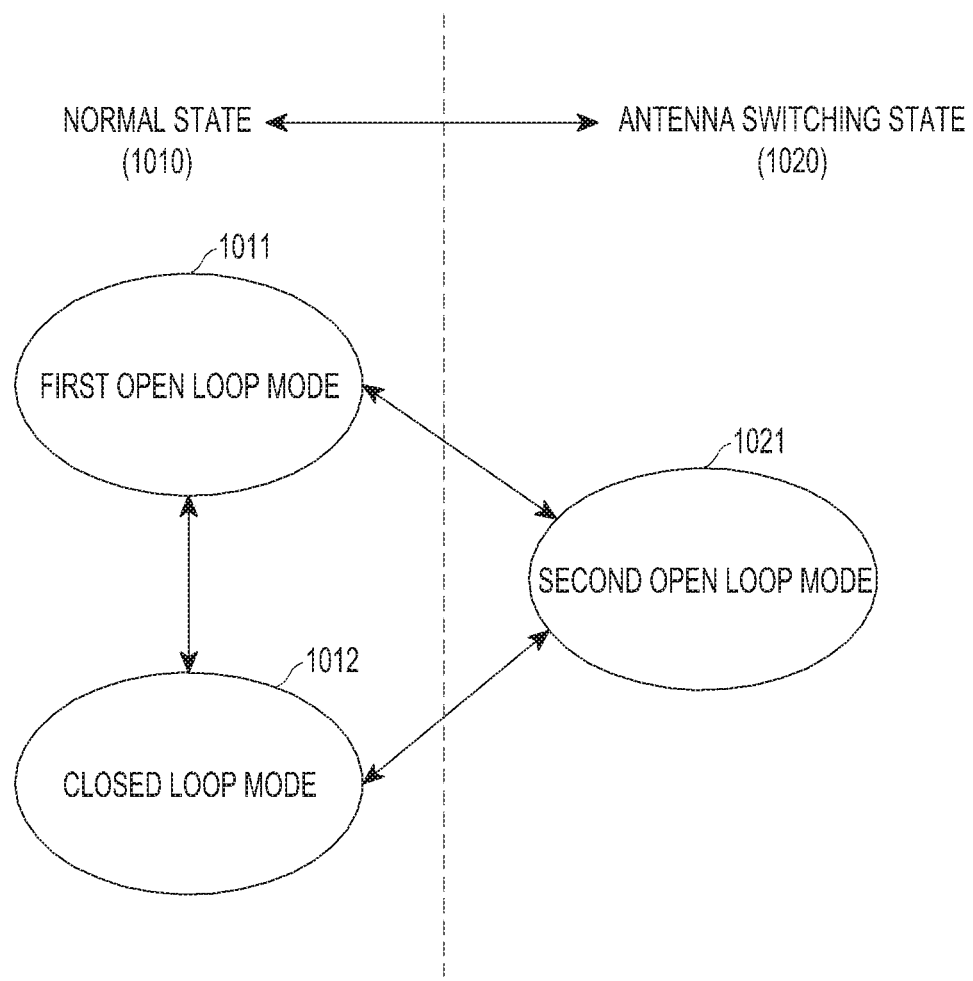
FIG. 10 is a block diagram illustrating an operation mode of antennas included in the electronic device according to various embodiments of the present disclosure.

FIG. 10 is a block diagram illustrating an operation mode of antennas included in the electronic device 401 according to various embodiments of the present disclosure.

Referring to FIG. 10, a normal state 1010 refers to a state in which the first antenna unit 410 operates as the main antenna and the second antenna unit 420 operates as the sub antenna.

According to an embodiment, in the normal state 1010, the processor 620 or the RFIC module 450 may control the electronic device 401 to operate in a first open loop mode 1011 or a closed loop mode 1012. For example, when the electronic device 401 executes a voice call operation, the processor 620 or the RFIC module 450 may execute the first open loop mode 1011. Further, when the electronic device 401 executes data communication, the processor 620 or the RFIC module 450 may execute the closed loop mode 1012.

Whether to execute the first open loop mode 1011 may be determined by identifying a state of the electronic device 401 through a frequency band and a channel used during communication or detecting whether a USB/ear jack is inserted. A look-up table including a control value of the band switching circuit 520, the band adjusting circuit 540, or the tuner circuit 510 to improve the performance of the first antenna unit 410 or the second antenna unit 420 according to the state of the electronic device 401 may be stored in the memory 630 in advance. In the first open loop 1011, the processor 620 or the RFIC module 450 may determine a current state of the electronic device 401 and transfer the control value included in the look-up table corresponding to the current state to the band switching circuit 520, the band adjusting circuit 540, or the tuner circuit 510. The control value may be applied to the band switching circuit 520, the band adjusting circuit 540, or the tuner circuit 510, and thus applied to the electronic device 401 in the first open loop 1011.

When the operation of the first open loop mode 1011 is completed, the processor 620 or the RFIC module 450 of the electronic device 401 may execute the closed loop mode 1012. In the closed loop mode 1012, it may be determined whether a reflection loss in the frequency used by the first antenna unit 410 or the second antenna unit 420 is larger than or equal to a preset reference value. When the reflection loss is larger than or equal to the reference value, the processor 620 or the RFIC module 450 may adjust the frequency of the first antenna unit 410 or the second antenna unit 420 through the tuner circuit 510 with reference to the look-up table stored in advance in the memory 630. According to an embodiment, the look-up table including the control value of the tuner circuit 510 to improve the performance of the first antenna unit 410 or the second antenna unit 420 according to the reflection loss may be stored in the memory 630 in advance.

In the operation of the closed loop mode 1012 according to an embodiment, peripheral values of the control value currently used to control the tuner circuit 510 by the processor 620 or the RFIC module 450 are applied to the tuner circuit 510. The processor 620 or the RFIC module 450 may adjust the frequency of the first antenna unit 410 or the second antenna unit 420 by applying, to the tuner circuit 510, the control value making the reflection loss minimal or the control value making the reflection loss equal to or smaller than a reference value among the control values.

In the operation of the closed loop mode 1012, when the reflection loss is larger than or equal to the reference value, the processor 620 or the RFIC module 450 may apply the control value corresponding to the reflection loss in the look-up table stored in advance in the memory 630 to the tuner circuit 510 and apply peripheral values of the applied control value to the tuner circuit 510. The processor 620 or the RFIC module 450 may adjust the frequency of the first antenna unit 410 or the second antenna unit 420 by applying, to the tuner circuit 510, the control value making the reflection loss minimal or the control value making the reflection loss equal to or smaller than the reference value among the control values.

When the state of the electronic device 401, the frequency band, the channel, or whether the USB/ear jack is inserted is changed during the execution of the closed loop mode 1012, the electronic device 401 may operate in the first open loop mode 1011. The RFIC module 450 or the processor 620 may extract the control value corresponding to the changed state from the look-up table stored in advance in the memory 630, apply the control value to the band switching circuit 520, the band adjusting circuit 540, or the tuner circuit 510, and then perform the operation of the closed loop mode 1012.

According to an embodiment, in the antenna switching state 1020, the processor 620 or the RFIC module 450 may control the electronic device 401 to operate in a second open loop mode 1021. When the second open loop mode 1021 is executed, the processor 620 or the RFIC module 450 may determine the current state of the electronic device 401 by identifying the frequency band and the channel currently used by the electronic device 401. A look-up table including a control value of the band switching circuit 520, the band adjusting circuit 540, or the tuner circuit 510 to improve the performance of the first antenna unit 410 or the second antenna unit 420 according to the current state of the electronic device 401 may be stored in the memory 630 of the electronic device 401. In the second open loop 1021, the processor 620 or the RFIC module 450 may determine the current state of the electronic device 401 and apply the control value of the look-up table corresponding to the current state to the band switching circuit 520, the band adjusting circuit 540, or the tuner circuit 510.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:
1. An electronic device comprising:
a first antenna;
a second antenna;
a transmission/reception path unit including a main transmission path and a main reception path provided with a duplexer for connecting to the first antenna or the second antenna operating as a main antenna;
a first reception path unit;
a second reception path unit including a low noise amplifier (LNA);
a signal path selection unit configured to connect each of the first antenna and the second antenna to the transmission/reception path unit, the first reception path unit, or the second reception path unit; and
a radio frequency integrated circuit (RFIC) module or a processor including the RFIC module configured to:
control the signal path selection unit to have a first state in which the first antenna is connected to the main transmission path and the main reception path of the transmission/reception path unit and the second antenna is connected to the second reception path unit when the first antenna operates as the main antenna, and
control the signal path selection unit to have a second state in which the first antenna is connected to the first reception path unit and the second antenna is connected to the main transmission path and the main reception path of the transmission/reception path unit when the second antenna operates as the main antenna.

2. The electronic device of claim 1, wherein the LNA is closer to the second antenna rather than the first antenna.

3. The electronic device of claim 1, wherein the RFIC module or the processor is further configured to:
measure strengths of signals received by the first antenna and the second antenna, and
control the signal path selection unit to have the first state or the second state based on the strengths of the signals.

4. The electronic device of claim 3, wherein the RFIC module or the processor is further configured to control the signal path selection unit to have the second state when a difference between the strength of the signal received through the second antenna and the strength of the signal received through the first antenna is larger than or equal to a predetermined threshold.

5. The electronic device of claim 1, wherein the RFIC module or the processor is further configured to control the signal path selection unit to have the second state when transmission power of a signal transmitted through the first antenna is larger than or equal to a predetermined threshold.

6. The electronic device of claim 1, wherein the RFIC module or the processor is further configured to control the signal path selection unit to have the second state when transmission power of a signal transmitted through the first antenna is larger than or equal to a predetermined threshold and a command for increasing the transmission power is received.

7. The electronic device of claim 1, further comprising:
a band adjusting circuit configured to adjust a frequency of the first antenna to be included in a frequency band including a first frequency; and
a tuner circuit configured to adjust the first antenna to have the first frequency.

8. The electronic device of claim 7, wherein the RFIC module and the band adjusting circuit, and the RFIC module and the tuner circuit are connected to each other through one mobile industry processor interface (MIPI) line.

9. The electronic device of claim 7, wherein the RFIC module or the processor is further configured to:
control the signal path selection unit to operate in an open loop mode or a closed loop mode in the first state, and
control the signal path selection unit to operate in the open loop mode in the second state.

10. The electronic device of claim 9, wherein the RFIC module or the processor is further configured to:
control the band adjusting circuit and the tuner circuit based on a band and a channel used by the electronic device in the open loop mode, and
control the tuner circuit based on a reflection loss of a transmitted signal in the closed loop mode.

11. A method for controlling antennas of an electronic device, the method comprising:
if a first antenna operates as a main antenna and a second antenna operates as a sub antenna, determining performance of the first antenna corresponding to the main antenna;

determining whether the performance of the first antenna is suitable for the main antenna; and maintaining or switching the main antenna and the sub antenna based on a result of the determination, wherein maintaining or switching the main antenna and the sub antenna comprises either connecting the first antenna to a transmission/reception path unit and the second antenna to a second reception path unit including a low noise amplifier (LNA) or connecting the first antenna to a first reception path unit and the second antenna to the transmission/reception path unit, wherein the maintaining or switching of the main antenna and the sub antenna comprises:

if the performance of the first antenna is suitable for the main antenna, controlling the electronic device to have a first state in which the first antenna is connected to the transmission/reception path unit and the second antenna is connected to the second reception path unit; and if the performance of the first antenna is not suitable for the main antenna, controlling the electronic device to have a second state in which the first antenna is connected to the first reception path unit and the second antenna is connected to the transmission/reception path unit.

12. The method of claim 11, wherein the LNA is closer to the second antenna rather than the first antenna.

13. The method of claim 11, wherein determining the performance of the first antenna corresponding to the main antenna comprises measuring strengths of signals received by the first antenna and the second antenna, and wherein maintaining or switching the main antenna and the sub antenna based on the result of the determination comprises controlling the electronic device to have the first state or the second state based on the strengths of the signals.

14. The method of claim 13, wherein controlling the electronic device to have the first state or the second state based on the strengths of the signals comprises controlling the electronic device to have the second state if a difference between the strength of the signal received through the second antenna and the strength of the signal received through the first antenna is larger than or equal to a predetermined threshold.

15. The method of claim 13, wherein controlling the electronic device to have the first state or the second state based on the strengths of the signals comprises controlling the electronic device to have the second state when transmission power of a signal transmitted through the first antenna is larger than or equal to a predetermined threshold.

16. The method of claim 11, further comprising controlling the electronic device to have the second state if transmission power of a signal transmitted through the first antenna is larger than or equal to a predetermined threshold and a command for increasing the transmission power is received.

17. The method of claim 11, wherein a frequency of the first antenna is adjusted using a band adjusting circuit that adjusts the frequency of the first antenna to be included in a frequency band including a first frequency and a tuner circuit that adjusts the first antenna to have the first frequency, wherein the band adjusting circuit and the tuner circuit are controlled through a radio frequency integrated circuit (RFIC) module, and wherein the RFIC module and the band adjusting circuit, and the RFIC module and the tuner circuit are connected to each other through one mobile industry processor interface (MIPI) line.

18. The method of claim 17, further comprising controlling, by the RFIC module, the electronic device to operate in an open loop mode or a closed loop mode in the first state and to operate in the open loop mode in the second state.

19. The method of claim 18, wherein the RFIC module is further configured to:

control the band adjusting circuit and the tuner circuit based on a band and a channel used by the electronic device in the open loop mode, and control the tuner circuit based on a reflection loss of a transmitted signal in the closed loop mode.

* * * * *